United States Patent
Malinowski et al.

(10) Patent No.: US 11,094,822 B1
(45) Date of Patent: Aug. 17, 2021

(54) SOURCE/DRAIN REGIONS FOR TRANSISTOR DEVICES AND METHODS OF FORMING SAME

(71) Applicant: GLOBALFOUNDRIES U.S. Inc., Santa Clara, CA (US)

(72) Inventors: Arkadiusz Malinowski, Dresden (DE); Baofu Zhu, Hillsboro, OR (US); Judson R. Holt, Ballston Lake, NY (US); Shiv Kumar Mishra, Mechanicville, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/751,380

(22) Filed: Jan. 24, 2020

(51) Int. Cl.
| | | |
|---|---|---|
| *H01L 29/76* | (2006.01) | |
| *H01L 21/84* | (2006.01) | |
| *H01L 29/80* | (2006.01) | |
| *H01L 29/78* | (2006.01) | |
| *H01L 27/12* | (2006.01) | |
| *H01L 29/06* | (2006.01) | |
| *H01L 29/66* | (2006.01) | |
| *H01L 21/02* | (2006.01) | |
| *H01L 29/10* | (2006.01) | |

(52) U.S. Cl.
CPC .... *H01L 29/7848* (2013.01); *H01L 21/02381* (2013.01); *H01L 29/105* (2013.01); *H01L 29/6656* (2013.01); *H01L 29/66636* (2013.01); *H01L 29/0653* (2013.01)

(58) Field of Classification Search
CPC ............ H01L 21/02381; H01L 29/105; H01L 29/66636; H01L 29/6656; H01L 29/7848
See application file for complete search history.

(56) References Cited

U.S. PATENT DOCUMENTS

| | | |
|---|---|---|
| 7,696,568 B2 | 4/2010 | Hwang et al. |
| 8,236,659 B2 | 8/2012 | Tsai et al. |
| 8,497,180 B2 | 7/2013 | Javorka et al. |
| 9,064,961 B2 | 6/2015 | Wasyluk et al. |

(Continued)

OTHER PUBLICATIONS

Malinowski et al., "What is Killing Moore's Law? Challenges in Advanced FinFET Technology Integration," Proceedings of the 26th International Conference "Mixed Design of Integrated Circuits and Systems," Jun. 27-29, 2019.

(Continued)

*Primary Examiner* — David C Spalla
(74) *Attorney, Agent, or Firm* — Hoffman Warnick LLC

(57) ABSTRACT

One illustrative transistor device disclosed herein includes a gate structure positioned above a semiconductor substrate and first and second overall cavities formed in the semiconductor substrate on opposite sides of the gate structure. In this example, each of the first and second overall cavities comprise a substantially vertically oriented upper epitaxial cavity and a lower insulation cavity, wherein the substantially vertically oriented upper epitaxial cavity extends from an upper surface of the semiconductor substrate to the lower insulation cavity. The transistor also includes an insulation material positioned in at least a portion of the lower insulation cavity of each of the first and second overall cavities and epitaxial semiconductor material positioned in at least the substantially vertically oriented upper epitaxial cavity of each of the first and second overall cavities.

20 Claims, 22 Drawing Sheets

(56) References Cited

U.S. PATENT DOCUMENTS

| | | |
|---|---|---|
| 9,299,776 B2 | 3/2016 | Grivna et al. |
| 9,419,082 B2 | 8/2016 | Mishra et al. |
| 9,490,348 B2 | 11/2016 | Ching et al. |
| 9,812,573 B1 | 11/2017 | Malinowski et al. |
| 2006/0060856 A1* | 3/2006 | Anderson ....... H01L 21/823814 257/66 |
| 2012/0161238 A1 | 6/2012 | Scheiper et al. |
| 2013/0082309 A1 | 4/2013 | Su et al. |
| 2015/0048453 A1* | 2/2015 | Ching ............. H01L 21/823431 257/347 |
| 2015/0097197 A1 | 4/2015 | Ganz et al. |
| 2017/0294522 A1 | 10/2017 | Pandey et al. |
| 2019/0013402 A1 | 1/2019 | Singh et al. |

OTHER PUBLICATIONS

U.S. Appl. No. 15/960,965, filed Apr. 24, 2018, entitled "Methods, Apparatus, and System for Reducing Leakage Current in Semiconductor Devices".

* cited by examiner

SOURCE/DRAIN REGIONS FOR TRANSISTOR DEVICES AND METHODS OF FORMING SAME

BACKGROUND

Field of the Invention

The present disclosure generally relates to various novel embodiments of source/drain regions for transistor devices and methods of making such source/drain regions.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either N-type (NFET) or P-type (PFET) devices, wherein the "N" and "P" designation is based upon the type of dopants used to create the source/drain regions of the devices. So-called CMOS (Complementary Metal Oxide Semiconductor) technology or products refers to integrated circuit products that are manufactured using both NFET and PFET transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region of the transistor.

Device designers are under constant pressure to increase the performance of transistor devices as well as increase packing densities in IC products. Device designers sometimes focus on trying to increase the magnitude of the current when the transistor is "ON"—Ion—while also trying to decrease the magnitude of the current flowing through the transistor when the transistor is turned "OFF"—Ioff. However, in advanced CMOS integrated circuit products, improving on-state drive current (Ion) while avoiding substantial increases in the off-state current (Ioff) can be very challenging. For example, in the case of FinFET devices, aggressive fin pitch scaling has resulted in smaller volumes of epitaxial semiconductor material being formed on the portions of the fins that are located in the source/drain regions. As a result, the amount of desirable stress (tensile for NFET devices and compressive for PFET devices) that can be imparted to the channel region of the transistor device from the epitaxial semiconductor material that is formed on the fins in the source/drain regions is reduced. Device designers also focus on trying to reduce the overlap capacitance (Coy) and, thus, the overall capacitance of a transistor device to increase the switching speed of the transistor and to reduce the parasitic losses associated with the charging and discharging of the capacitor each time the transistor is switched.

The present disclosure is generally directed to various novel embodiments of source/drain regions for transistor devices and methods of making such source/drain regions.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of source/drain regions for transistor devices and methods of making such source/drain regions. One illustrative transistor device disclosed herein includes a gate structure positioned above a semiconductor substrate and first and second overall cavities formed in the semiconductor substrate on opposite sides of the gate structure. In this example, each of the first and second overall cavities comprise a substantially vertically oriented upper epitaxial cavity and a lower insulation cavity, wherein the substantially vertically oriented upper epitaxial cavity extends from an upper surface of the semiconductor substrate to the lower insulation cavity. The transistor also includes an insulation material positioned in at least a portion of the lower insulation cavity of each of the first and second overall cavities and epitaxial semiconductor material positioned in at least the substantially vertically oriented upper epitaxial cavity of each of the first and second overall cavities.

BRIEF DESCRIPTION OF THE DRAWINGS

The disclosure may be understood by reference to the following description taken in conjunction with the accompanying drawings, in which like reference numerals identify like elements, and in which.

Figure 1:
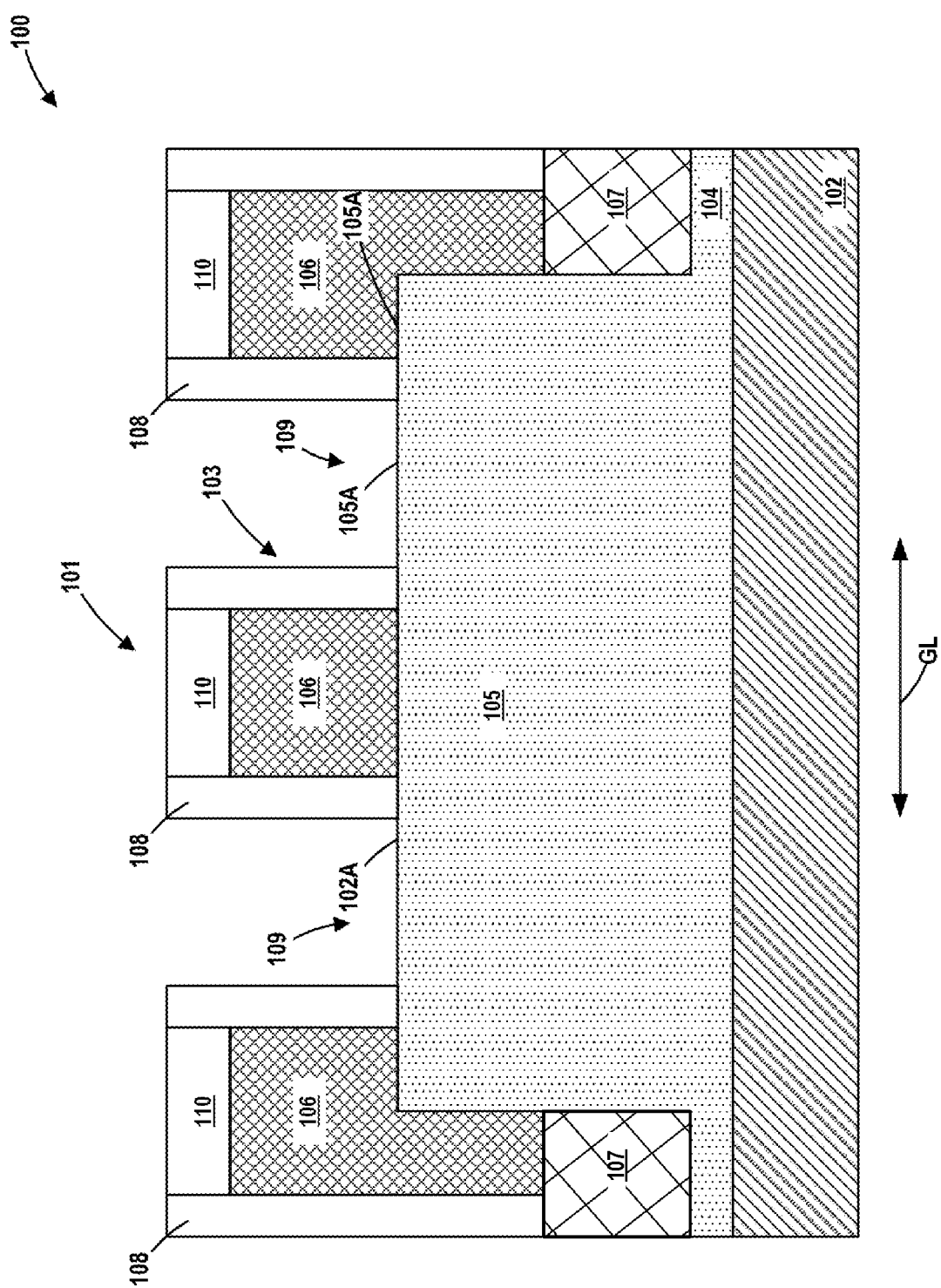
FIGS. 1-22 depict various novel embodiments of source/drain regions for transistor devices and methods of making such source/drain regions. It should be noted that the attached drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed methods and devices may be applicable to a variety of products, including, but not limited to, logic products, memory products, etc. With reference to the attached figures, various illustrative embodiments of the methods and devices disclosed herein will now be described in more detail.

FIGS. 1-22 depict various embodiments of an integrated circuit (IC) product 100 that includes a transistor device 101 with various novel embodiments of source/drain regions for the transistor device 101 and methods of making such source/drain regions. As will be appreciated by those skilled in the art after a complete reading of the present application, the transistor device 101 disclosed herein may be an N-type or a P-type device and it may be formed on a bulk semiconductor substrate or a semiconductor-on-insulator substrate. Moreover, the transistor device 101 disclosed herein may come in a variety of different forms, e.g., a planar device, a FinFET device, etc. Additionally, the gate structure of the transistor device 101 disclosed herein may be manufactured using known gate-first or replacement gate manufacturing techniques. For purposes of disclosure only, the transistor device 101 described below will be FinFET devices that are formed above a bulk semiconductor substrate 102 wherein the gate structure of the transistor device 101 is formed by performing known replacement-gate manufacturing techniques. However, as noted above, the various inventions disclosed herein should not be considered to be limited to the particular example shown in the attached drawings and described below.

FIG. 1 depicts the IC product 100 after several steps have been taken to form the transistor device 101 above the bulk semiconductor substrate 102. FIG. 1 depicts the transistor device 101 after an illustrative fin 105, with an upper surface 105A, has been formed in the semiconductor substrate 102 by performing traditional manufacturing techniques. Of course, the transistor device 101 may comprise any number of fins 105. In the case where the transistor device 101 is a planar device, the upper surface 105A would correspond to the upper surface 102A of the substrate 102. Thus, as used herein and in the appended claims, reference to the upper surface of a semiconductor substrate should be understood to include the upper surface of a fin, when the device is a FinFET device, as well as the uppermost surface of a planar semiconductor substrate when the device is a planar transistor device. Also, as used herein and in the appended claims, reference to a semiconductor substrate should be understood to include a substantially planar semiconductor substrate as well as a fin structure formed in the semiconductor substrate. As noted above, the transistor device 101 may also be formed on a semiconductor-on-insulator (SOI) substrate that includes a base semiconductor layer, a buried insulation layer and an active semiconductor layer positioned above the buried insulation layer, wherein transistor devices are formed in and above the active semiconductor layer. The substrate (irrespective of its form) may be made of silicon or it may be made of semiconductor materials other than silicon, e.g., germanium, SiGe, an III-V material, etc. Thus, the terms "substrate" or "semiconductor substrate" should be understood to cover all semiconducting materials and all forms of such materials. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application.

FIG. 1 depicts the transistor device 101 after several process operations. In one illustrative process flow, after forming and cutting the fin(s) 105 to the desired length, an isolation structure 107 was formed in the substrate 102 by performing known etching, deposition and planarization techniques. The isolation structure 107 may be comprised of a variety of different materials, e.g., silicon dioxide, etc. Thereafter, a doped well region 104 was formed in the fin 105/substrate 102 by performing known ion implantation techniques. The doping of the well region 104 depends upon the type (N or P) of the transistor device 101. In the case where the transistor device 101 is a P-type transistor, the well region 104 will be doped with an N-type dopant. In the case where the transistor device 101 is an N-type transistor, the well region 104 will be doped with a P-type dopant. The concentration of the dopant material in the well region 104 may vary depending upon the particular application. The gate length (GL) direction, or current-transport direction, of the transistor device 101 is depicted in the drawings.

As noted above, in the particular example depicted herein, the gate structure of the transistor device 101 will be formed by performing known replacement-gate manufacturing techniques. Accordingly, FIG. 1 depicts a sacrificial gate structure 106, a gate cap 110 and a sidewall spacer 108 positioned adjacent the sacrificial gate structure 106. Collectively, the sacrificial gate structure 106, the gate cap 110 and the sidewall spacer 108 define a gate 103. As is common, the sacrificial gate structure 106 typically comprises a layer of sacrificial gate insulation material (not separately shown), e.g., silicon dioxide, and a layer of sacrificial gate electrode material (not separately shown), e.g., amorphous silicon, polysilicon, etc. The gate cap 110 may be comprised of a material such as silicon nitride. The techniques for forming the sacrificial gate structure 106 and the gate cap 110 are well known to those skilled in the art. After formation of the sacrificial gate structure 106 and the gate cap 110, the simplistically depicted sidewall spacer 108 was formed around and adjacent the entire perimeter of the sacrificial gate structure 106. Although only a single sidewall spacer 108 is depicted in the drawings, in practice, more than one sidewall spacer may be formed adjacent the sacrificial gate structure 106. The sidewall spacer 108 may be formed by depositing a conformal layer of spacer material (not shown) above the substrate 102 and thereafter performing an anisotropic etching process to remove horizontally positioned portions of the layer of spacer material. The spacer 108 may be of any desired thickness (as measured at its base) and it may be comprised of a variety of different materials, e.g., silicon dioxide, a low-k material, silicon nitride, SiCN, SiN, SiCO, and SiOCN, etc. For a FinFET transistor device, source/drain regions 109 will be formed in the fin 105 formed in the substrate 102 between the spacers 108 on the gate structures 106. For a planar transistor device (not shown), the source/drain regions 109 will be formed in the substrate 102 between the spacers 108 on the gate structures 106.

Figure 2:
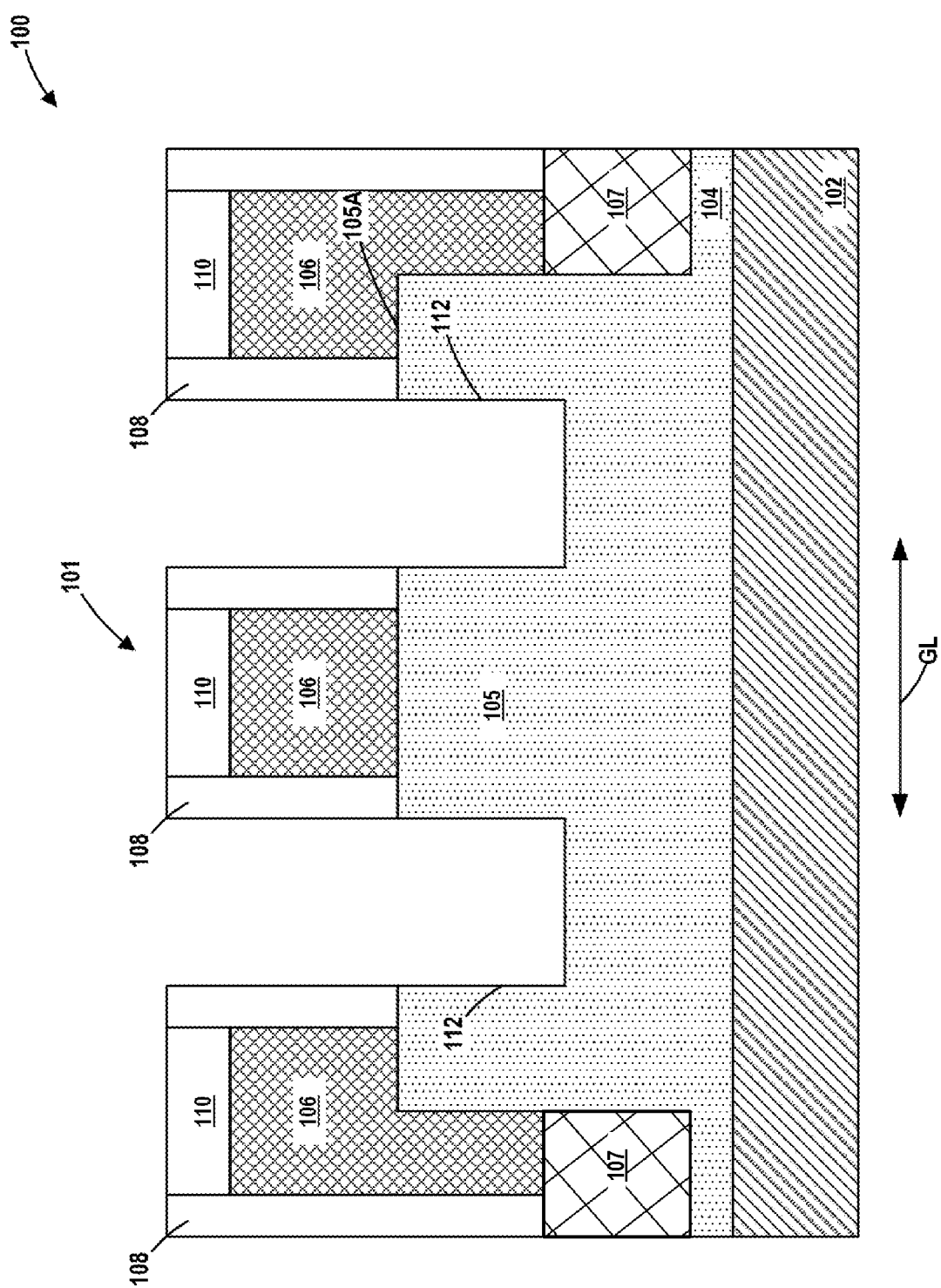

As will be described more fully below, various process operations will be performed to form first and second overall cavities 121 (see FIG. 6) in the semiconductor substrate 102 (in this example, in the fin 105) on opposite sides of the gate structure 106. Each of the first and second overall cavities 121 has the same basic configuration when viewed in a cross-section taken though the first and second overall cavities 121 in a direction that corresponds to the gate length (GL) direction of the transistor device 101. Accordingly, FIG. 2 depicts the transistor device 101 after a first etching process, e.g., an anisotropic etching process, was performed to form a plurality of upper epitaxial cavities 112 in the fin 105. The depth of the upper epitaxial cavities 112 may vary depending upon the particular application. In one illustrative embodiment, based upon current-day technology, the depth of the upper epitaxial cavities 112 below the upper surface 105A of the fin 105 may be about 40-60 nm. In the presently disclosed example, the upper epitaxial cavities 112 are substantially vertically oriented and substantially self-aligned with respect to the adjacent sidewall spacers 108.

Figure 3:
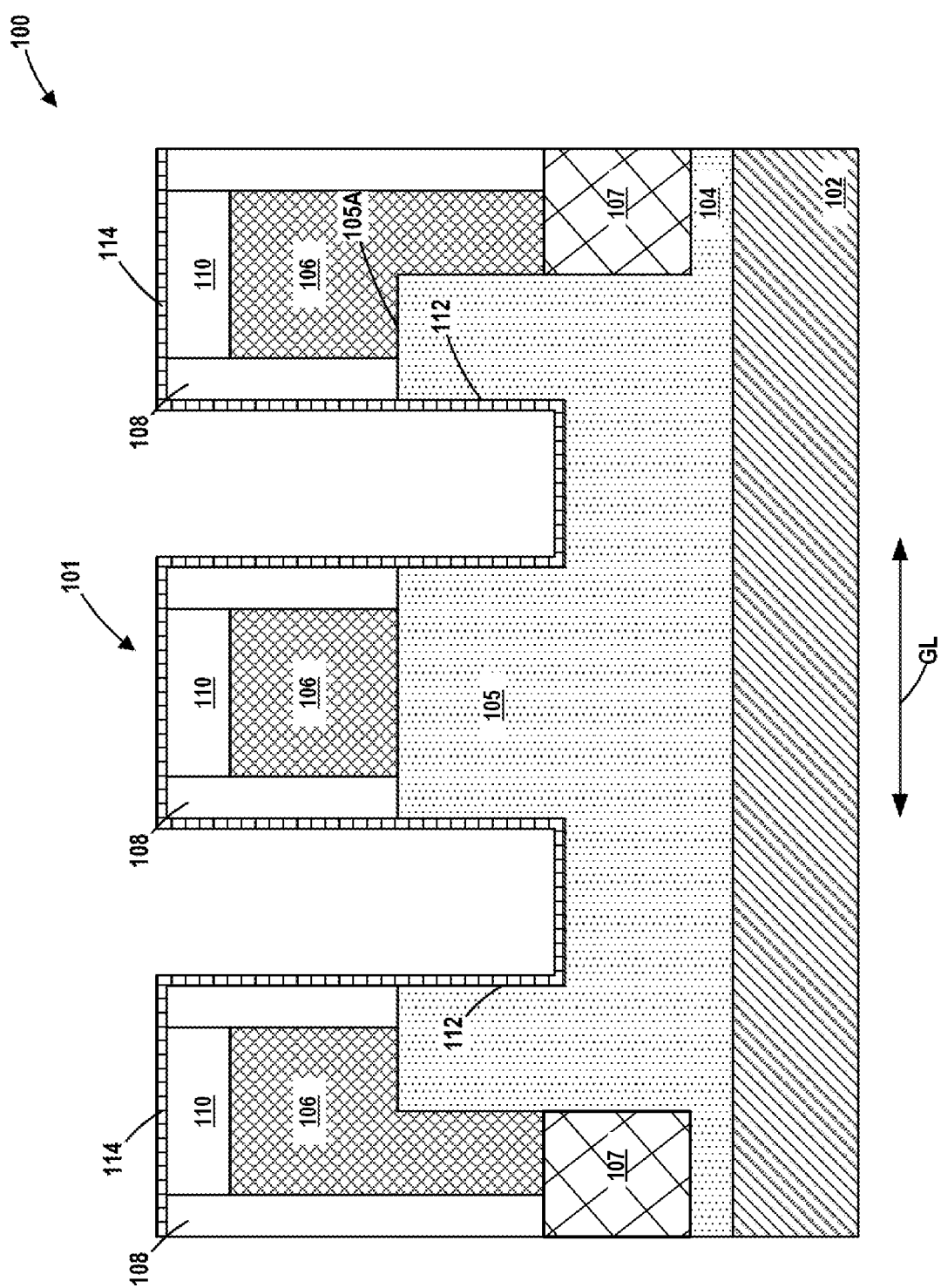

FIG. 3 depicts the transistor device 101 after a conformal deposition process was performed to form a conformal layer of insulating material 114 on the product 100 and within the upper epitaxial cavities 112. The conformal layer of insulating material 114 may be comprised of a variety of different materials, e.g., silicon dioxide, silicon nitride, and it may be formed to any desired thickness, e.g., 4-5 nm, based upon current-day technology.

Figure 4:
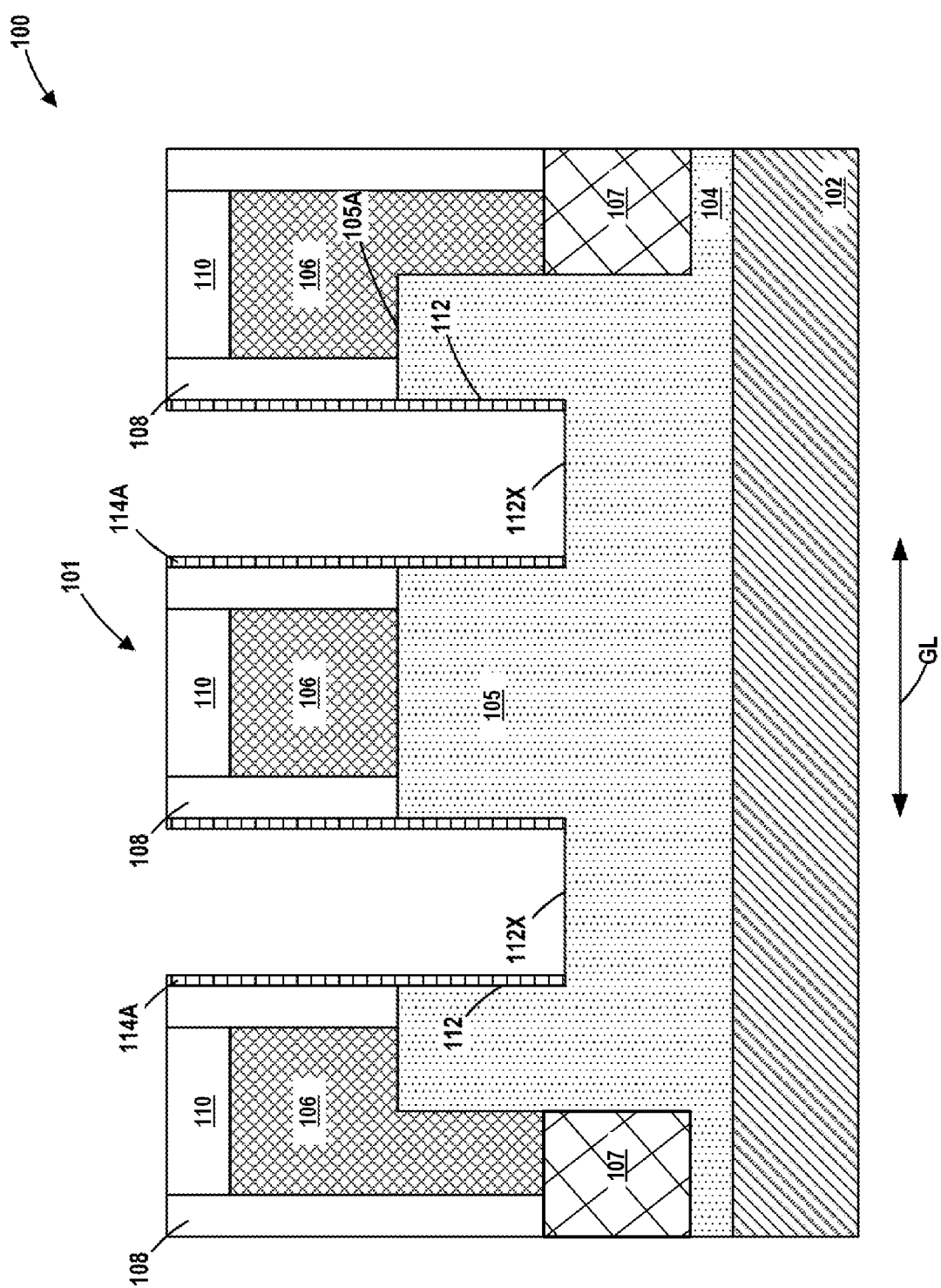

FIG. 4 depicts the transistor device 101 after an anisotropic etching process was performed on the conformal layer of insulating material 114 so as to remove substantially horizontally oriented portions of the conformal layer of insulating material 114. This operation results in the formation of a sacrificial internal sidewall spacer 114A within each of the upper epitaxial cavities 112. Note that, after formation of the internal sidewall spacer 114A, the bottom surface 112X of each of the upper epitaxial cavities 112 is exposed.

Figure 5:
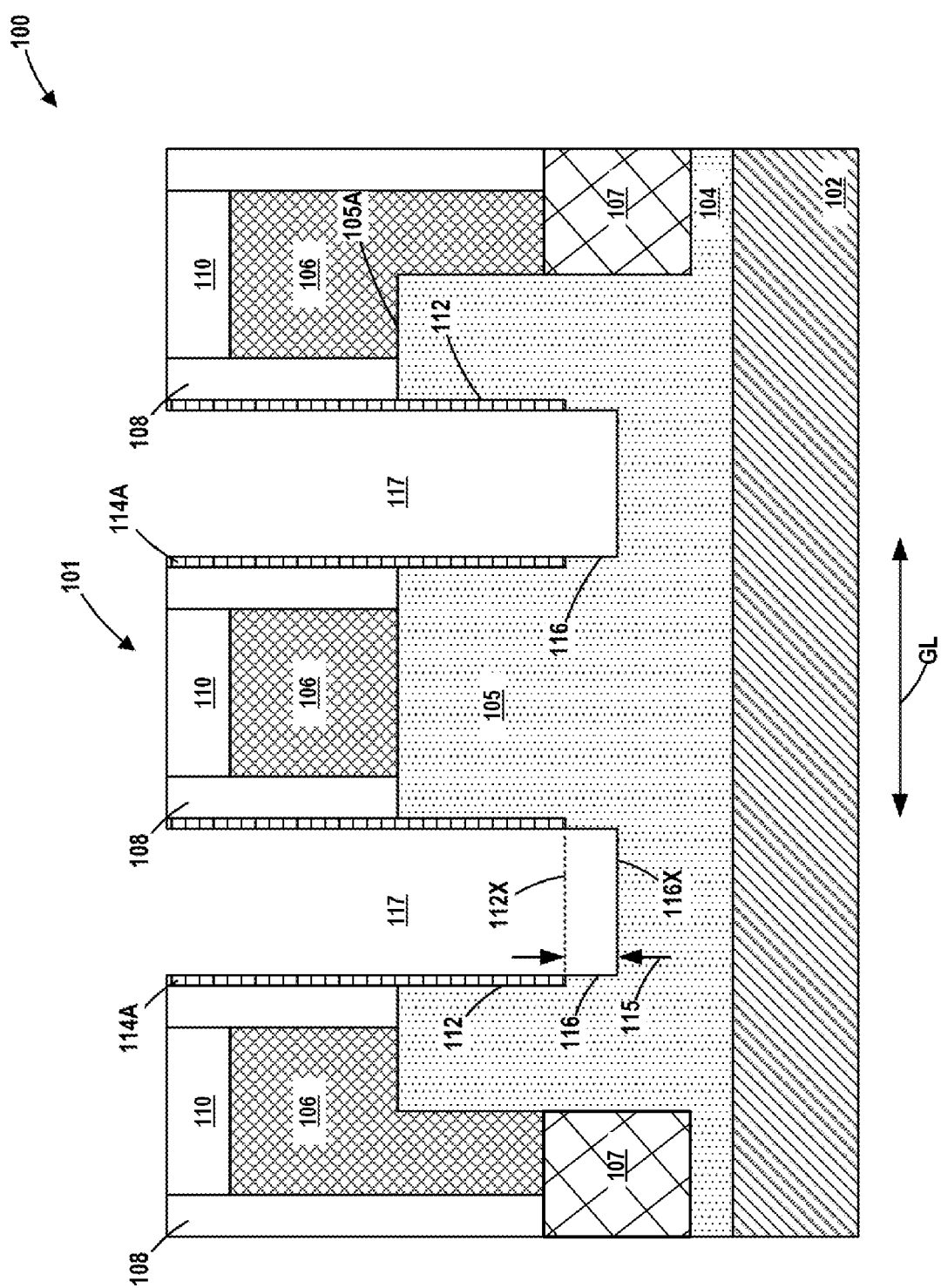

FIG. 5 depicts the transistor device 101 after another anisotropic etching process was performed to form another epitaxial cavity 116 below each of the upper epitaxial cavities 112. As depicted, in one illustrative embodiment, the epitaxial cavities 116 are substantially self-aligned with respect to the internal sidewall spacer 114A within each of the upper epitaxial cavities 112, and the epitaxial cavities 116 effectively extend the depth of the upper epitaxial cavities 112. The epitaxial cavities 116 have a bottom surface 116X that is positioned at a level within the substrate 102 below the bottom surface 112X of the upper epitaxial cavities 112. In one illustrative example, the difference 115 in the vertical position of the bottom surface 112X of the upper epitaxial cavities 112 and the bottom surface 116X of the epitaxial cavities 116 may be about 10-20 nm, based upon current-day technology.

Figure 6:
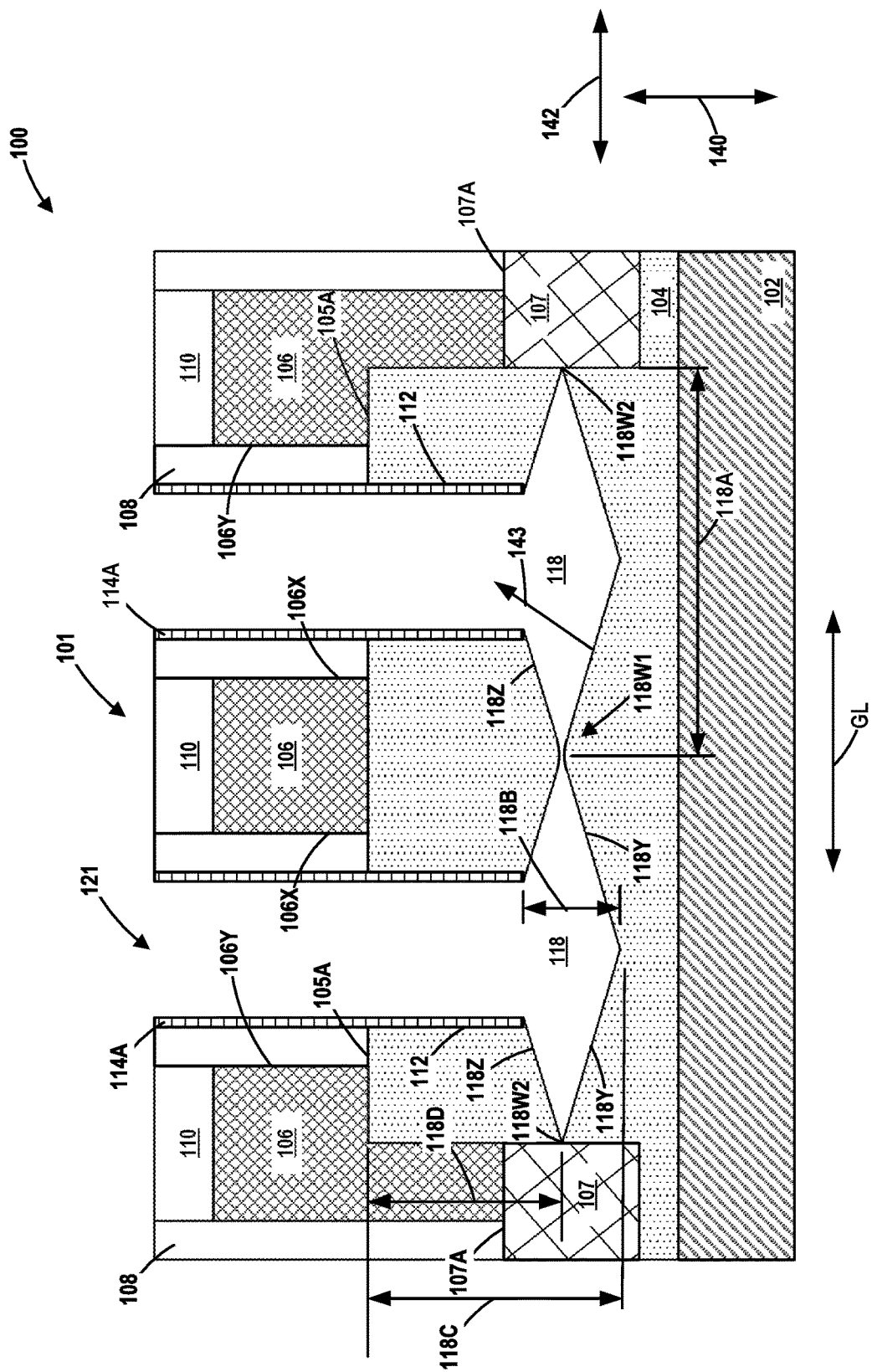

FIG. 6 depicts the transistor device 101 after a crystallographic wet etch process was performed. Such an etching process may be performed using an etchant such as TMAH (tetramethylammoniumhydroxide), KOH, etc. This process operation results in the formation of a lower insulation cavity 118 at the bottom of each of the upper epitaxial cavities 112. In one illustrative embodiment, the lower insulation cavity 118 may have a sigma-shaped (or diamond-shaped) cross-sectional configuration in a cross-section taken through the lower insulation cavity 118 in a direction corresponding to the gate length direction of the transistor device 101. The silicon substrate 102 has a crystalline structure wherein the <100> crystal direction is indicated by the double arrow 140, the <110> crystal direction is indicated by the double arrow 142 and the <111> crystal direction (normal to the faceted surface 118Y) is indicated by the arrow 143. As will be appreciated by those skilled in the art, such a TMAH or KOH based wet etch process can have a substantially greater etch rate in the <100> crystal direction than in the <111> crystal direction.

In the depicted example, the bottom of the lower insulation cavity 118 is formed by the intersection of two lower faceted surfaces 118Y. However, in other embodiments, the lower insulation cavity 118 may have a substantially planar bottom surface for at least a portion of the overall length 118A of the lower insulation cavity 118. Such a planar bottom surface would intersect the inclined or faceted surfaces 118Y. In the depicted example, the lower faceted surfaces 118Y intersect the upper faceted surfaces 118Z at apexes 118W1, 118W2 that will collectively be referenced using the designation 118W. In the example shown in FIG. 6, the lower insulation cavities 118 are formed such that they intersect one another under the gate structure 106 of the transistor 101, i.e., the apexes 118W1 of the lower insulation cavities 118 meet and the lower insulation cavities 118 are in communication with one another. In other cases, the lower insulation cavities 118 may be formed in such a manner that they do not intersect one another. Of course, as will be appreciated by those skilled in the art after a complete reading of the present application, the overall size and configuration of the lower insulation cavities 118 may vary depending upon the particular application and the lower insulation cavities 118 are not limited to the illustrative sigma-shape (or diamond-shape) cross-sectional configuration depicted in FIG. 6, as the lower insulation cavities 118 may have a variety of different configurations.

In the depicted example, the upper epitaxial cavity 112 extends from the surface 105A of the fin 105 to the lower insulation cavity 118. Each of the first and second overall cavities 121 comprises an upper epitaxial cavity 112 and a lower insulation cavity 118.

The physical size and resulting positioning of the illustrative sigma-shaped lower insulation cavities 118 relative to other structures or features on the IC product 100 may vary depending upon the particular application. Accordingly, the following illustrative dimensions are provided only by way of example based upon current-day technology, and such dimensional examples should not be considered to be limitations to the various inventions disclosed herein. The lower insulation cavities 118 have an overall width 118A (in the gate length direction) and an overall height or vertical thickness 118B. In one illustrative example, the overall width 118A may be about 30-60 nm and the overall height or vertical thickness 118B may be about 10-20 nm. The bottom of the lower insulation cavities 118 may be positioned a distance 118C of about 50-80 nm below the upper surface 105A of the fin 105. The apexes 118W1, 118W2 of the lower insulation cavities 118 may be positioned a distance 118D of about 45-70 nm below the upper surface 105A of the fin 105. In one particularly illustrative example, the apex 118W1 of each of the lower insulation cavities 118 may extend under the sidewalls 106X of the gate structure 106 of the transistor 101 for any desired distance. In other cases, the lower insulation cavities 118 may be formed in such a manner that the apex 118W1 of each of the lower insulation cavities 118 is positioned vertically below the sidewall spacer 108 on the transistor 101. As depicted, the opposite apex, i.e., 118W2, of each of the lower insulation cavities 118 may extend under the adjacent gate structures for any desired distance and may even contact the isolation structure 107. In other applications, the apex 118W1 of each of the lower insulation cavities 118 may not extend under the sidewalls 106X of the gate structure 106 at all. Note that the lateral width 118A of the lower insulation cavities 118 in the gate length direction of the transistor device 101 is greater than the lateral width of the substantially vertically oriented upper epitaxial cavity 112 in the gate length direction of the transistor device 101. The vertical distance between the upper surface 107A of the isolation structure 107 and the uppermost surface of the lower insulation cavity 118, e.g., at the bottom of the internal spacer 114A may be about 0-15 nm in one illustrative example. Additionally, the vertical distance between the upper surface 107A of the isolation structure 107 and the apexes 118W1, 118W2 of the lower insulation cavities 118 may be about 0-40 nm in one illustrative example. In one particular example, although not shown in the drawings, the upper surface 107A of the isolation structure 107 that is positioned adjacent the lower insulation cavity 118 may be aligned, i.e., substantially level, with the apex 118W2 of the lower insulation cavities 118. In some applications, the upper surface 107A of the isolation structure 107 may be positioned at a location that is approximately level with a midpoint of the vertical thickness 118B of the lower insulation cavities 118 shown in FIG. 6. Positioning the upper surface 107A of the isolation structure 107 relative to the lower insulation cavity 118 as described in the previous two sentences may lead to improved device performance.

Figure 7:
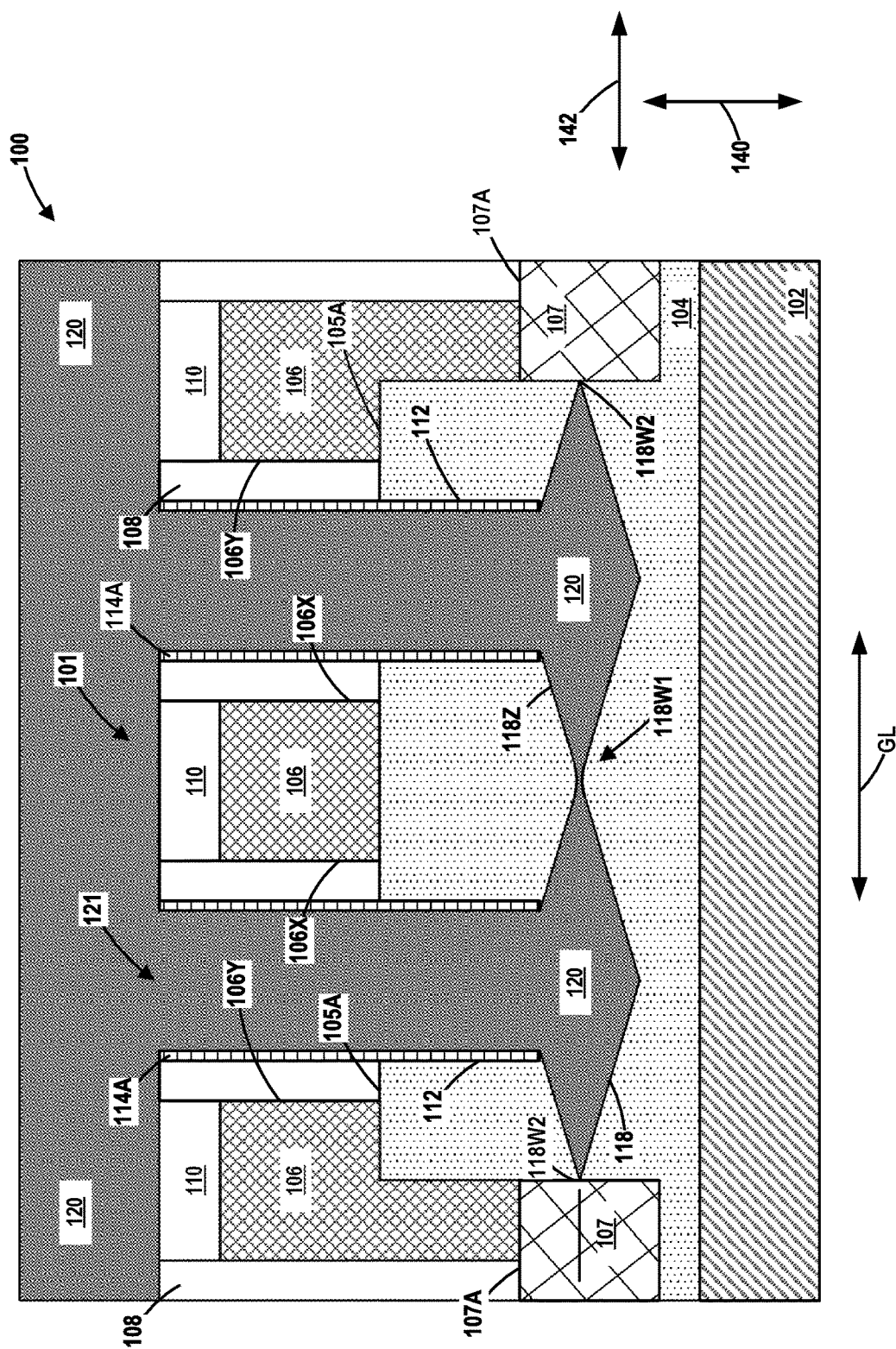

FIG. 7 depicts the transistor device 101 after an insulating material 120 was formed on the IC product 100. As depicted, the insulating material 120 substantially overfills both of the overall cavities 121, i.e., the combination of the lower insulation cavity 118 and the upper epitaxial cavity 112. The insulating material 120 may be any of a variety of different insulating materials, e.g., silicon dioxide, a low-k material (k value less than 3.5), silicon nitride, SiCN, SiN, SiCO and SiOCN, etc. The insulating material 120 may be formed by performing any of a variety of different known deposition processes or combinations of such processes, e.g., HDP, HARP, eHARP, FCVD, etc.

Figure 8:
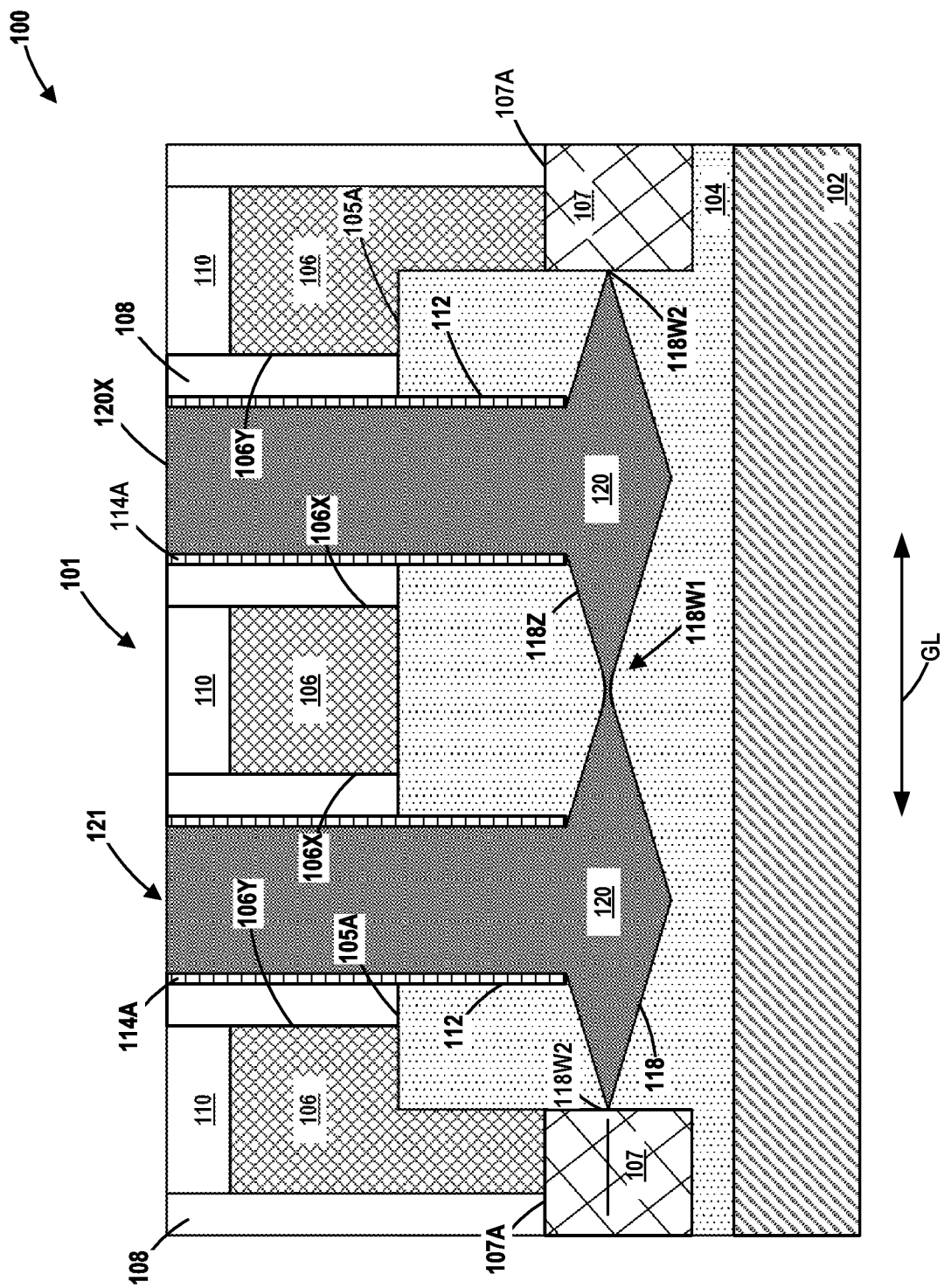

FIG. 8 depicts the transistor device 101 after a chemical mechanical planarization (CMP) or etch-back process operation was performed to planarize the upper surface of the insulating material 120. In one illustrative embodiment, a CMP process was performed on the insulating material 120 using the gate caps 110 as a polish-stop. After that process is completed, the insulating material 120 has an upper surface 120X.

Figure 9:
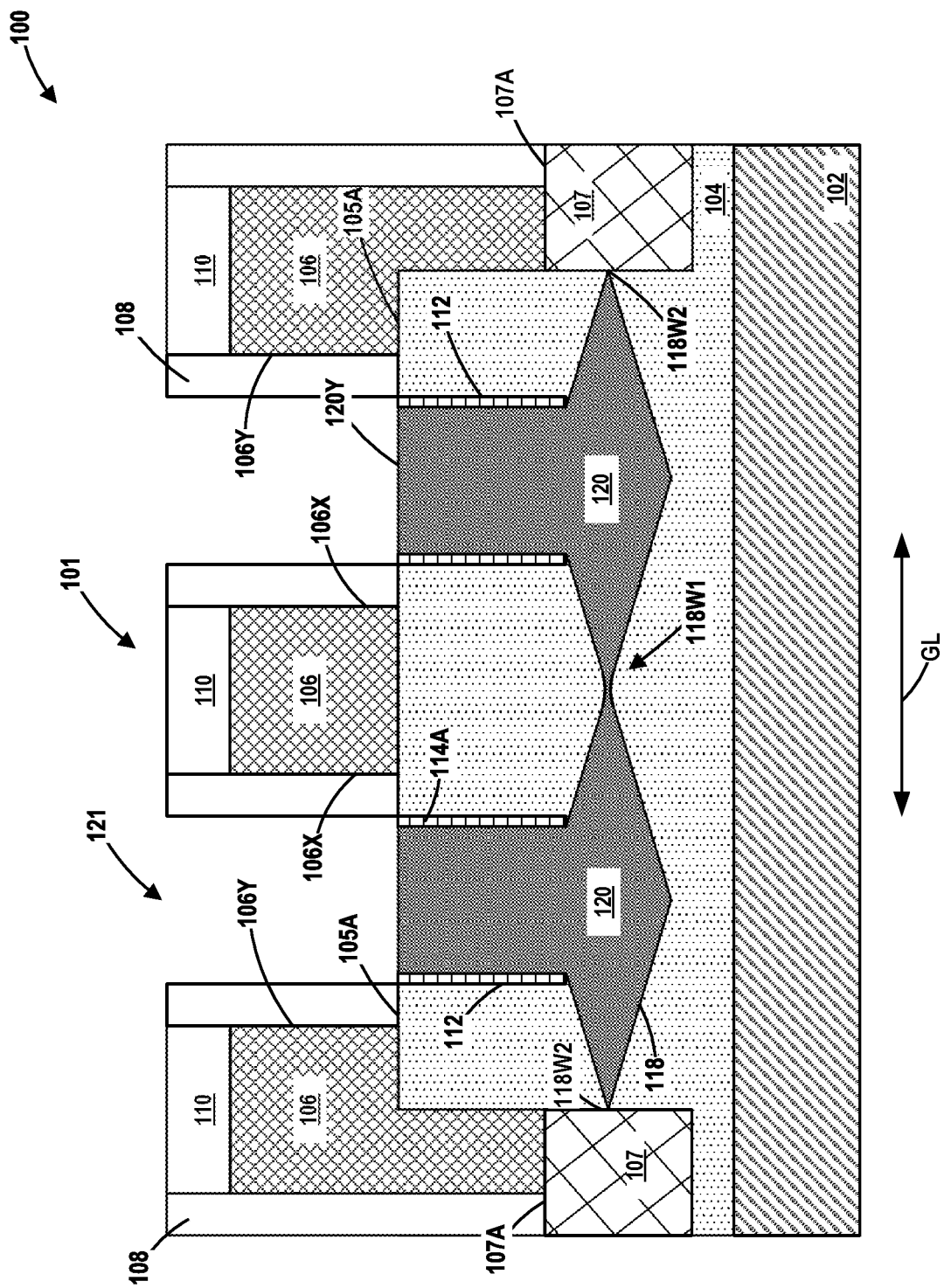

FIG. 9 depicts the transistor device 101 after a wet etching process was performed to remove portions of the insulating material 120 and portions of the sidewall spacers 114A positioned above the upper surface 105A of the fin 105. After this etching process is completed, the insulating material 120 has an upper surface 120Y that is approximately coplanar with the upper surface 105A of the fin 105. In the case where the insulating material 120 is comprised of silicon dioxide, the wet etching process may be a dilute HF acid etching process.

Figure 10:
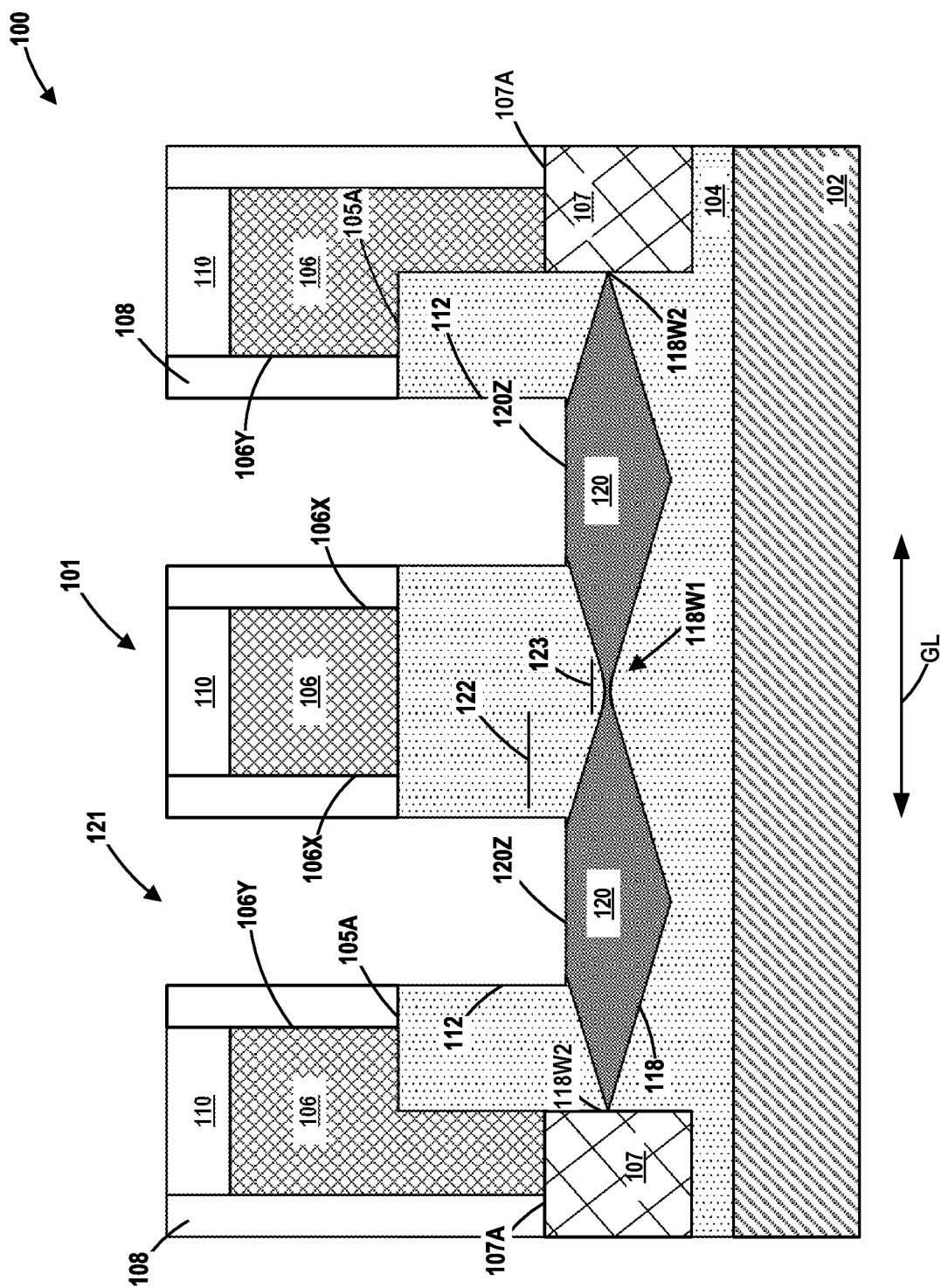

FIG. 10 depicts the transistor device 101 after a timed, anisotropic etching process (RIE) was performed to remove portions of the insulating material 120 and the sidewall spacer 114A positioned within the upper epitaxial cavities 112. After this etching process is completed, the insulating material 120 has an upper surface 120Z and the remaining portions of the sidewall spacer 114A have been removed, thereby exposing the sidewalls of the upper epitaxial cavities 112. The amount of recessing of the insulating material 120 may vary depending upon the particular application. In the example shown herein, the insulating material 120 is recessed such that insulating material is only positioned in the lower insulation cavities 118. In other applications, the recessing may be performed in such a manner that, after completion of the recess etching process, the recessed upper surface 120Z of the insulating material 120 may be positioned at the level 122 (wherein the insulating material 120 is positioned in both the lower insulation cavities 118 and the upper epitaxial cavities 112) or at the level 123 (wherein the insulating material 120 does not completely fill the lower insulation cavities 118). Of course, as will be appreciated by those skilled in the art after a complete reading of the present application, the illustrative etching sequence depicted in FIGS. 8-10 is but one illustrative process flow for arriving at the structure shown in FIG. 10.

Figure 11:
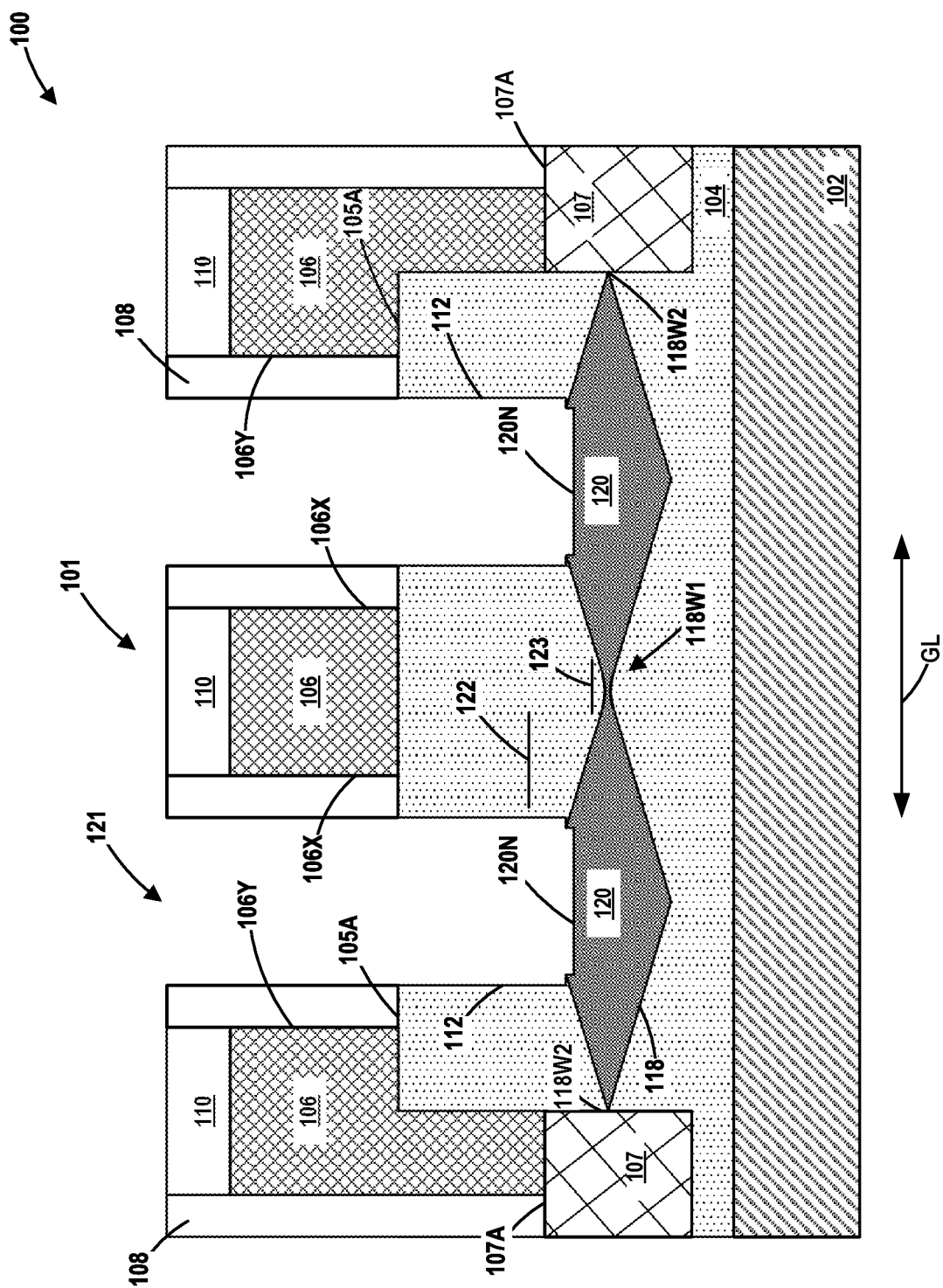

FIG. 11 depicts the transistor device 101 after a light epitaxy pre-cleaning process was performed to remove any remaining native insulating materials, e.g., oxides, on the sidewalls of the upper epitaxial cavities 112 (and perhaps portions of the lower insulation cavities 118 of the overall cavities 121 when the lower insulation cavities 118 are not completely filled with insulating material). Some erosion of the insulating material 120 may occur during this epitaxy pre-cleaning process, as reflected by the notch 120N in the insulating material 120.

Figure 12:
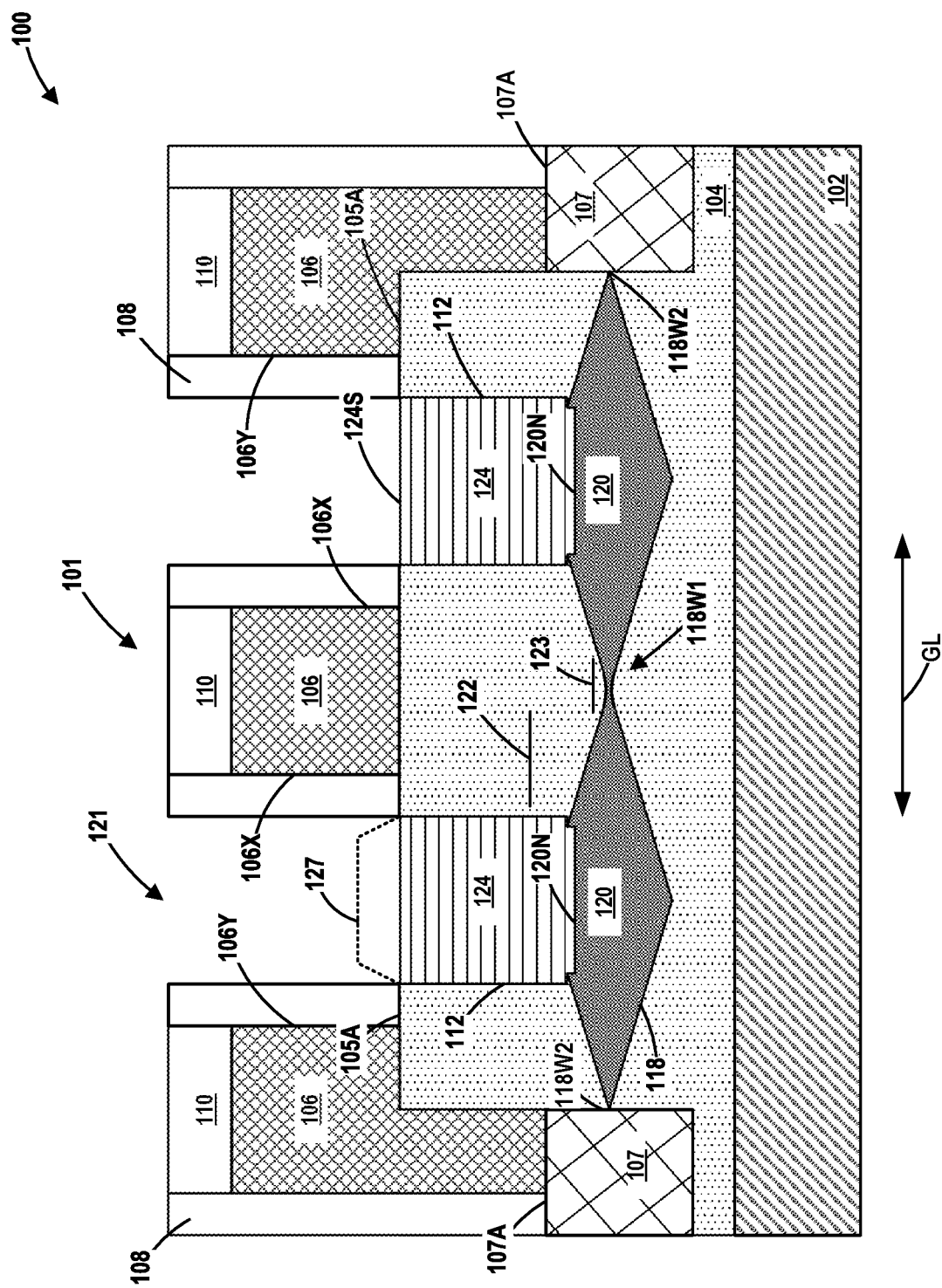

FIG. 12 depicts the transistor device 101 after an epitaxial growth process was performed to form simplistically depicted stressed epitaxial semiconductor material 124 in the unfilled portions of the overall cavities 121, i.e., the unfilled portions of the lower insulation cavities 118 (if any) and unfilled portions of the upper epitaxial cavities 112. In the depicted example, although the epitaxial material 124 does not grow on the previously formed insulation material 120, the epitaxial semiconductor material 124 may be formed in such a manner that after the epitaxial semiconductor material 124 is formed it may be positioned on and in contact with the previously formed insulation material 120 positioned in the lower insulation cavities 118. The epitaxial material 124 may be formed with any desired type of stress, e.g., (tensile for NFET devices or compressive for PFET devices). In the depicted example, the epitaxial growth process is controlled such that the upper surface 124S of the epitaxial semiconductor material 124 is approximately level with the upper surface 105A of the fin 105. In other cases, the epitaxial semiconductor material 124 may be grown in such a manner that it has an upper surface 127 (depicted in dashed lines) that is positioned above the upper surface 105A of the fin 105, i.e., raised source/drain regions.

The epitaxial semiconductor material 124 may comprise any of a variety of different semiconductor materials. For example, for a PFET transistor device 101, the epitaxial semiconductor material 124 may be silicon-germanium, silicon, etc. For an NFET transistor device 101, the epitaxial semiconductor material 124 may comprise silicon-carbon, silicon, etc. The epitaxial semiconductor material 124 may be undoped or doped with an appropriate dopant material. The epitaxial semiconductor material 124 may also be doped in situ, i.e., during the epitaxial growth process, with the appropriate dopant material for the type (N or P) of transistor device 101 under construction, e.g., phosphorous for an NFET device, boron for a PFET device. The epitaxial semiconductor material 124 may also be doped using traditional ion-implantation techniques. The concentration of dopant atoms in the epitaxial semiconductor material 124 may vary depending upon the particular application. The location of peak dopant concentration within the epitaxial semiconductor material 124 may also vary depending upon the particular application.

Figure 13:
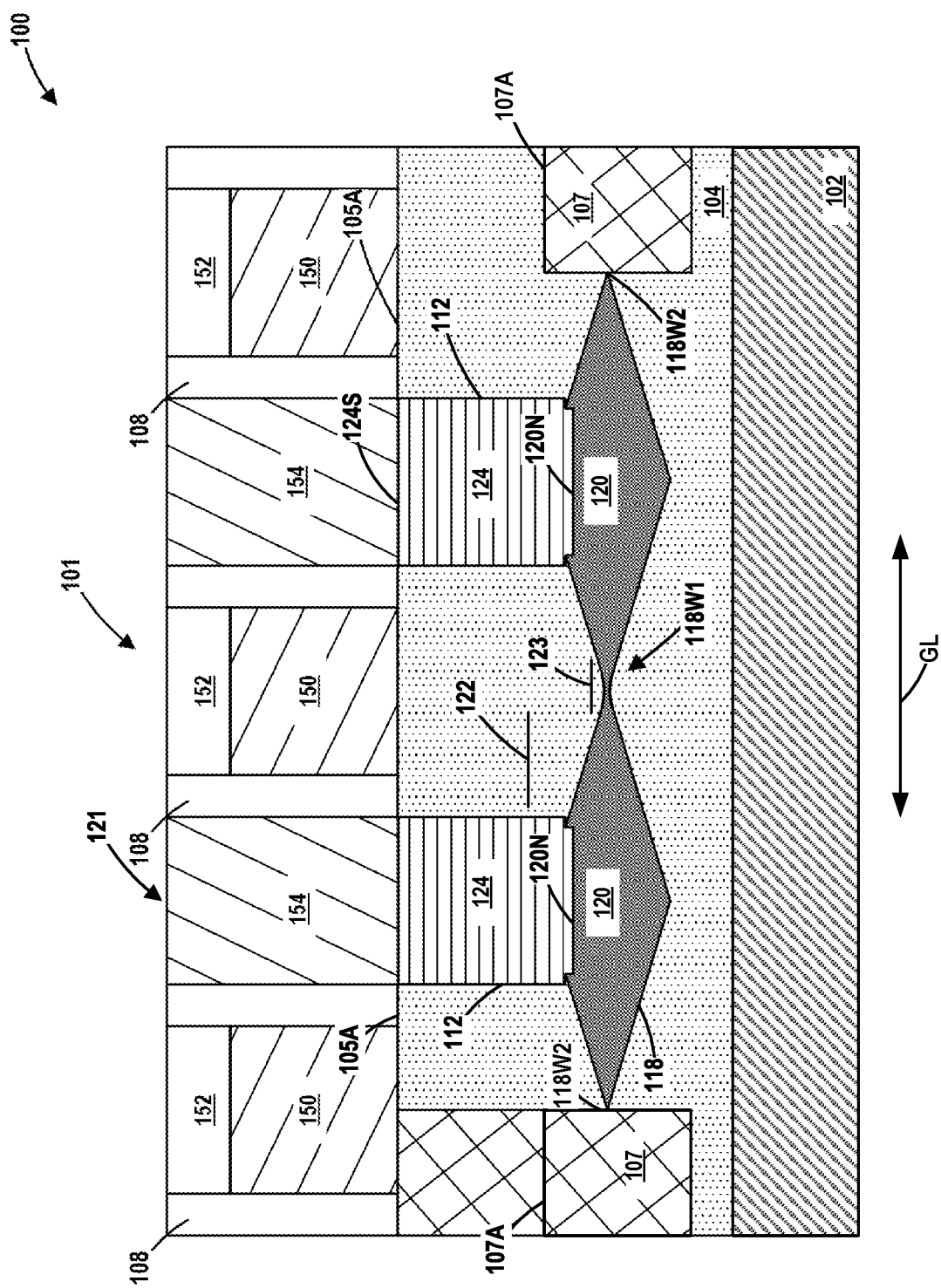

FIG. 13 depicts the product 100 after several known manufacturing techniques were performed to form one or more layers of insulation material 154 on the product, to remove the gate caps 110 and the sacrificial gate structures 106 and to form simplistically depicted final gate structures 150 and final gate caps 152 in their place. Note that a portion of the insulating material 120 positioned in each of the lower insulation cavities 118 is positioned vertically under a portion of the final gate structure 150. Note that, in this illustrative embodiment, the insulation material 120 in the lower insulation cavities 118 merges so as to form a substantially continuous layer of insulation material that extends under substantially the entire channel region of the transistor device 101 in both the gate length (GL) direction of the transistor device 101 and the gate width (GW) direction (into and out of the plane of the drawing page in FIG. 13). That is, in this embodiment, the channel region of the transistor device 101 is positioned vertically above a layer of insulation material 120 which improves parasitic capacitance (due to isolation from the bulk substrate). This configuration improves power consumption and is inherently radiation hardened (resistant to soft errors) reducing the need for redundancy, which may have application in RF applications. Even in cases where the insulation material 120 in the lower insulation cavities 118 does not merge or cannot merge (like in the embodiment shown in FIG. 15) there will still be insulation material 120 positioned under the channel region of the device and some of the benefits noted above in terms of device performance may be achieved to at least some degree.

Formation of the overall cavities 121 with the above-described unique configuration and positioning the insulating material 120 therein reduces leakage current that would otherwise flow between the source and drain regions. A transistor may be in a subthreshold region, i.e., when the gate-to-source voltage is less than the threshold voltage of the transistor. The subthreshold voltage region of a transistor may also be referred to as a weak-inversion region for the transistor. Typically, the drain voltage (Vd) of a transistor is at supply voltage (Vdd) and the gate voltage (Vg) is zero (Vg=0V) and the transistor (assumed to be an NFET device) is "OFF." When the transistor is OFF, it is assumed that no current flows from the source to the drain. But, in fact, there will be OFF-state current that flows to the drain of the transistor that is generally referred to as subthreshold voltage leakage current.

At the point of processing depicted in FIG. 13, traditional manufacturing operations may be performed to complete the transistor device 101, i.e., the formation of multiple layers of insulating material and various conductive structures that are conductively coupled to the source region, the drain region and the final gate structure 150 of the transistor device 101. The techniques involved in forming these conductive structures are well known to those skilled in the art.

Figure 14:
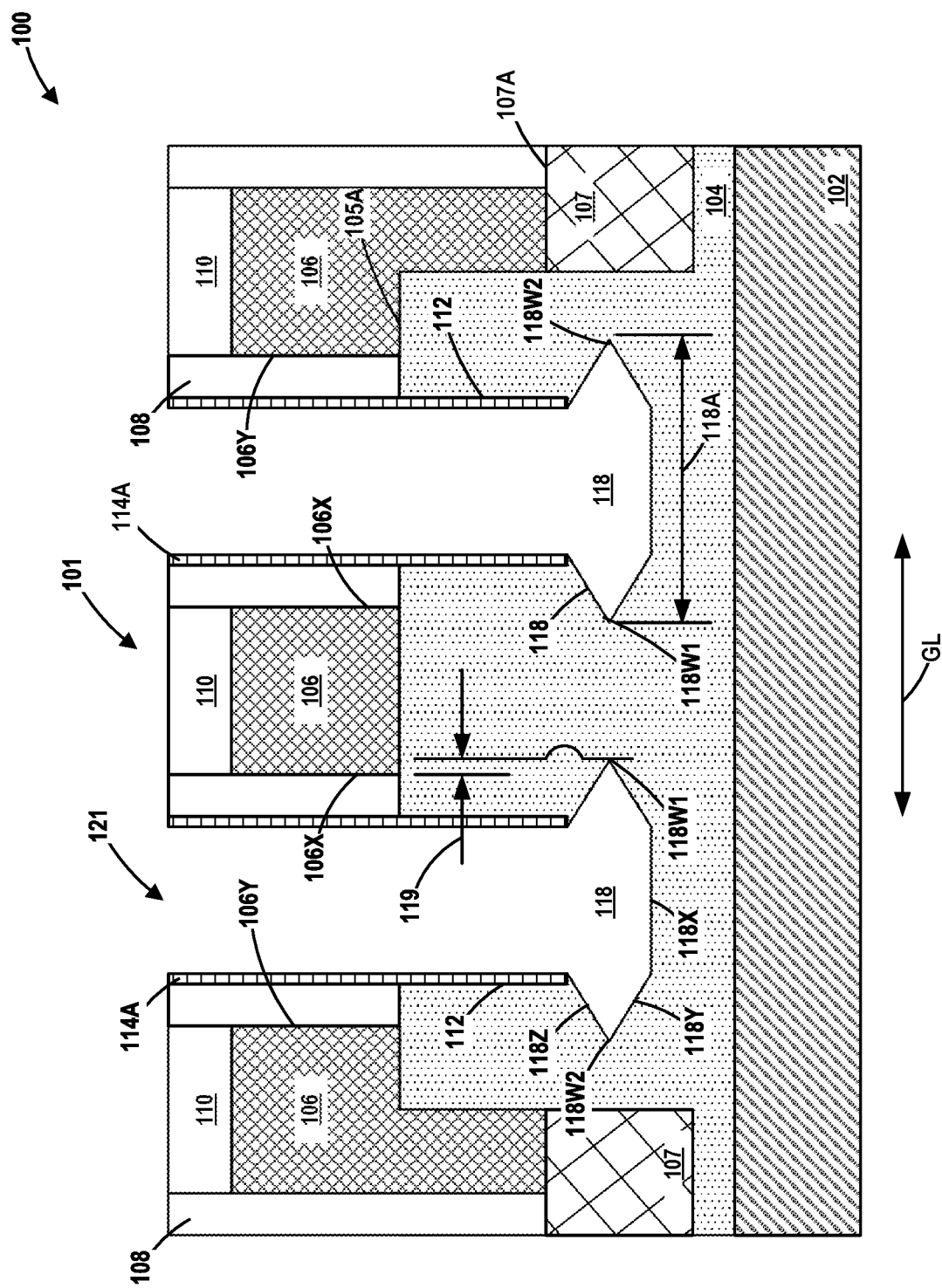
Figure 15:
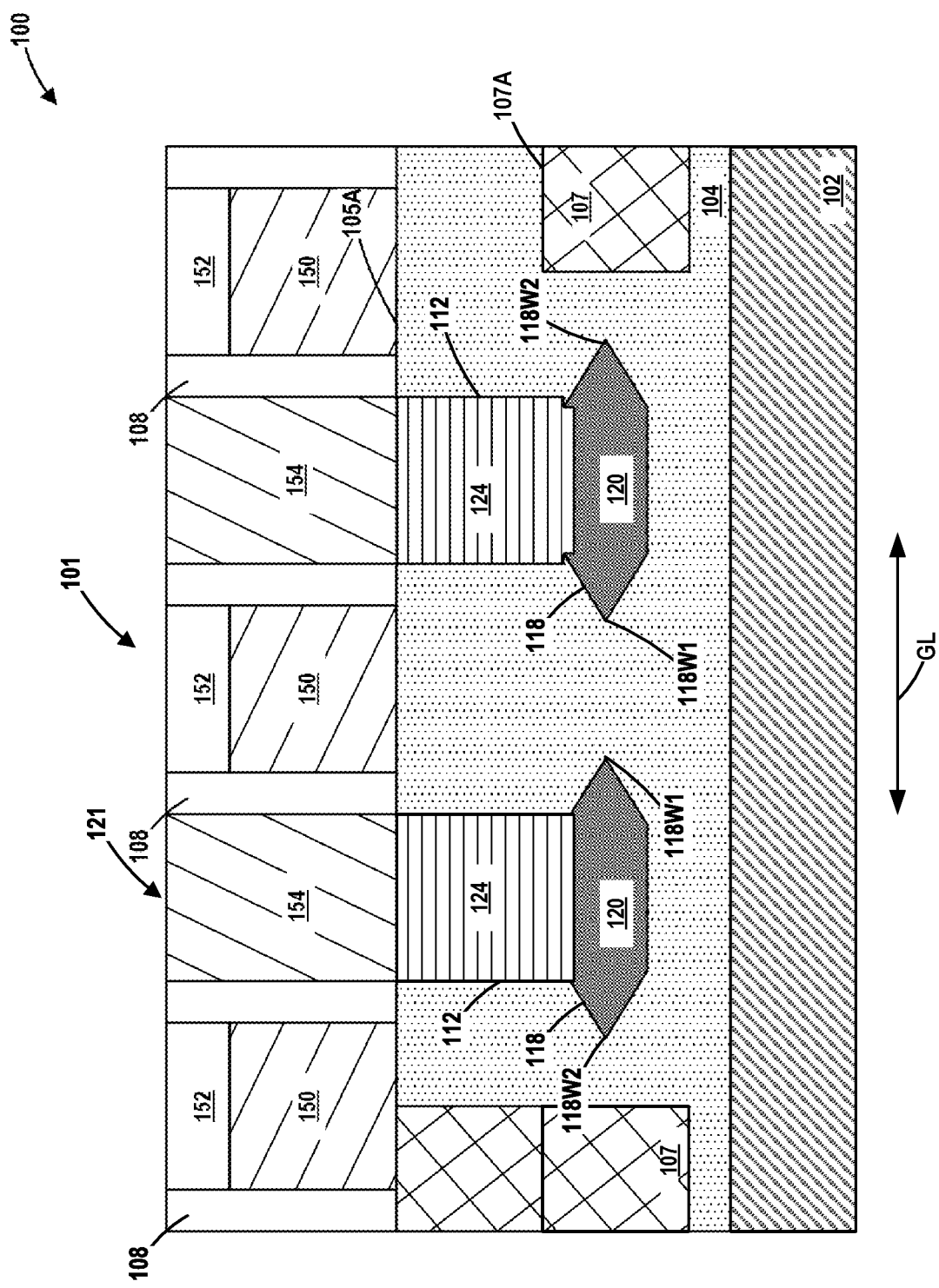

As will be appreciated by those skilled in the art after a complete reading of the present application, the novel source/drain regions disclosed herein may take a variety of forms and configurations. FIGS. 14-15 depict an embodiment wherein the lower insulation cavities 118 were formed such that they do not intersect one another. In this example, the size of the lower insulation cavities 118 shown in FIG. 14 is less than the size of the lower insulation cavities 118 shown in FIG. 6, e.g., the overall width 118A (in the gate length direction) of the lower insulation cavities 118 shown in FIG. 14 is less than the overall width 118A of the lower insulation cavities 118 shown in FIG. 6. In this example, the lower insulation cavities 118 also have a substantially planar bottom surface portion 118X that intersects the lower faceted surfaces 118Y. In one particularly illustrative example, the apex 118W1 of each of the lower insulation cavities 118 may extend under the sidewalls 106X of the gate structure 106 of the transistor 101 by a distance 119. In one illustrative example, the dimension 119 may be about 1-10 nm. Stated another way, in one embodiment, the lateral spacing between the apexes 118W1 of the lower insulation cavities 118 may be about 1-40 nm. As depicted, the opposite apex 118W2 of each of the lower insulation cavities 118 may extend under the sidewall 106Y of the adjacent gate structures as well. In other applications, the apex 118W1 of each of the lower insulation cavities 118 may not extend under the sidewalls 106X of the gate structure 106 of the transistor 101 at all. Note that, in this and the previous embodiment, the lateral width 118A of the lower insulation cavities 118 in the gate length direction of the transistor device 101 is greater than the lateral width of the substantially vertically oriented upper epitaxial cavity 112 in the gate length direction of the transistor device 101. FIG. 15 depicts the transistor 101 after the formation of the above-described stressed epitaxial semiconductor material 124 in the unfilled portions of the overall cavities 121, i.e., the unfilled portions of the lower insulation cavities 118 (if any) and unfilled portions of the upper epitaxial cavities 112 and after the formation of the above-described final gate structures 150 by performing the techniques described above.

Figure 16:
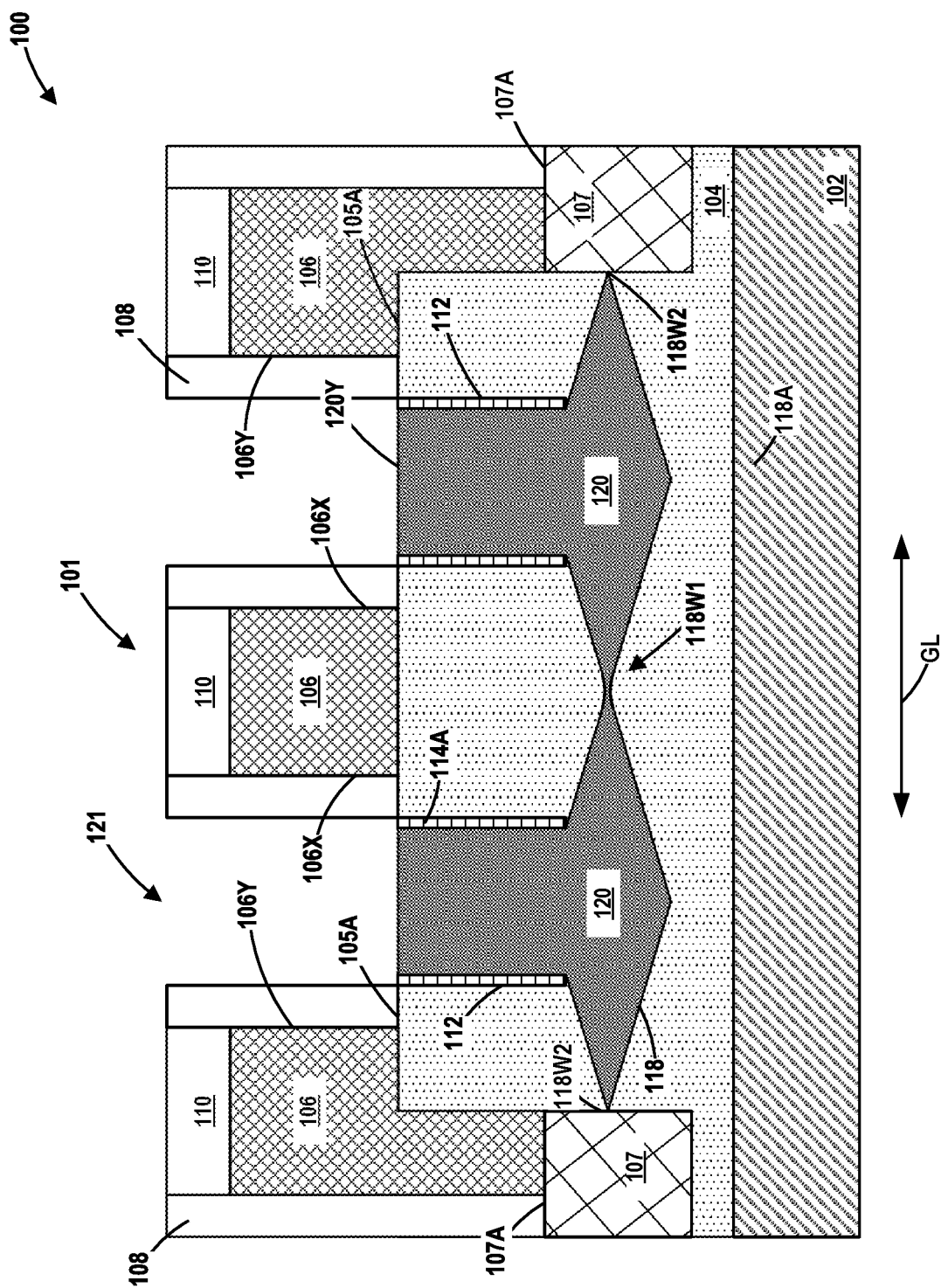
Figure 17:
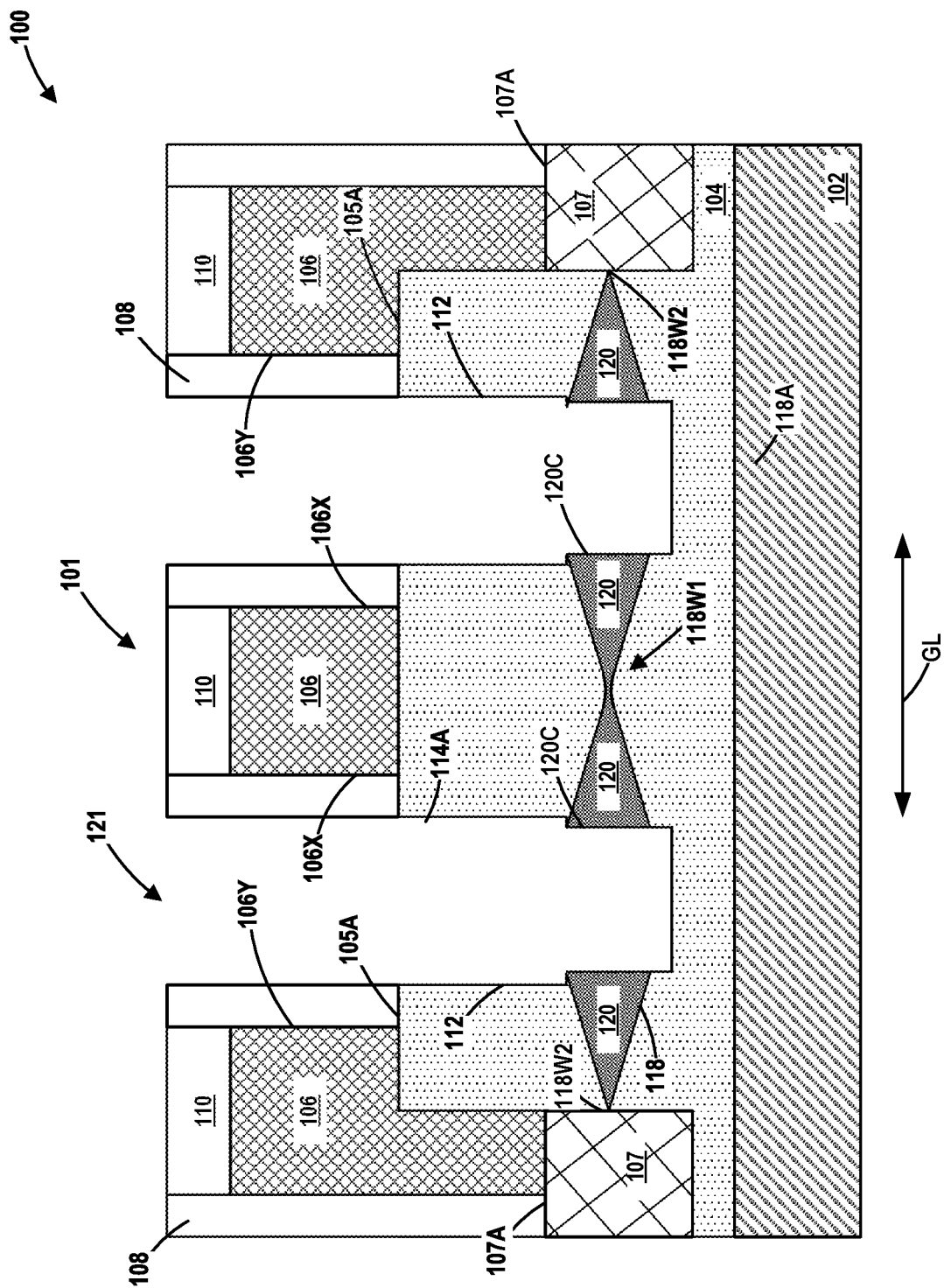
Figure 18:
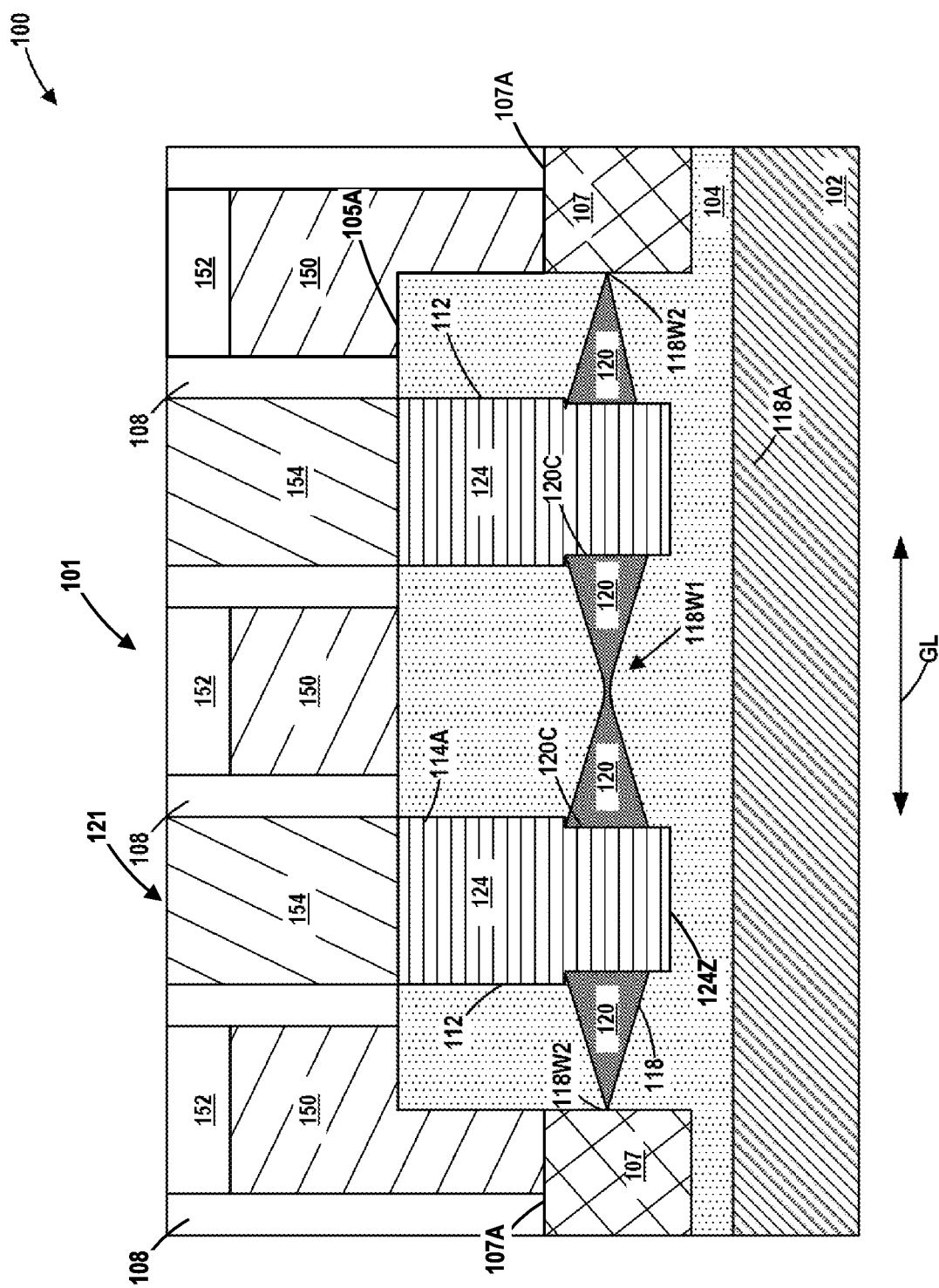

FIGS. 16-18 depict another illustrative embodiment of a transistor disclosed herein with novel source/drain regions. FIG. 16 depicts the IC product 100 at a point in processing that corresponds to that shown in FIG. 9, i.e., after the wet etching process was performed to remove portions of the insulating material 120 and portions of the sidewall spacer 114A positioned above the upper surface 105A of the fin 105.

FIG. 17 depicts the transistor device 101 after an anisotropic etching process (RIE) was performed to remove portions of the insulating material 120 and the sidewall spacer 114A positioned within the upper epitaxial cavities 112 as well as to remove portions of the insulating material 120 positioned in the lower insulation cavities 118. This results in the formation of an opening 120C in the insulating material 120 that exposes the substrate material at the bottom of the lower insulation cavities 118.

FIG. 18 depicts the transistor 101 after the formation of the above-described stressed epitaxial semiconductor material 124 in the unfilled portions of the overall cavities 121, i.e., the unfilled portions of the lower insulation cavities 118 (e.g., the opening 120C) and unfilled portions of the upper epitaxial cavities 112 and after the formation of the above-described final gate structures 150 by performing the techniques described above. Note that, in one embodiment, the bottom surface 124Z of the epitaxial semiconductor material 124 is positioned at a greater depth within the fin 105, i.e., deeper than the lowermost surface of the insulating material 120. That is, the epitaxial semiconductor material 124 extends completely through the entire vertical thickness of the insulation material 120 positioned in the lower insulation cavities 118.

Figure 19:
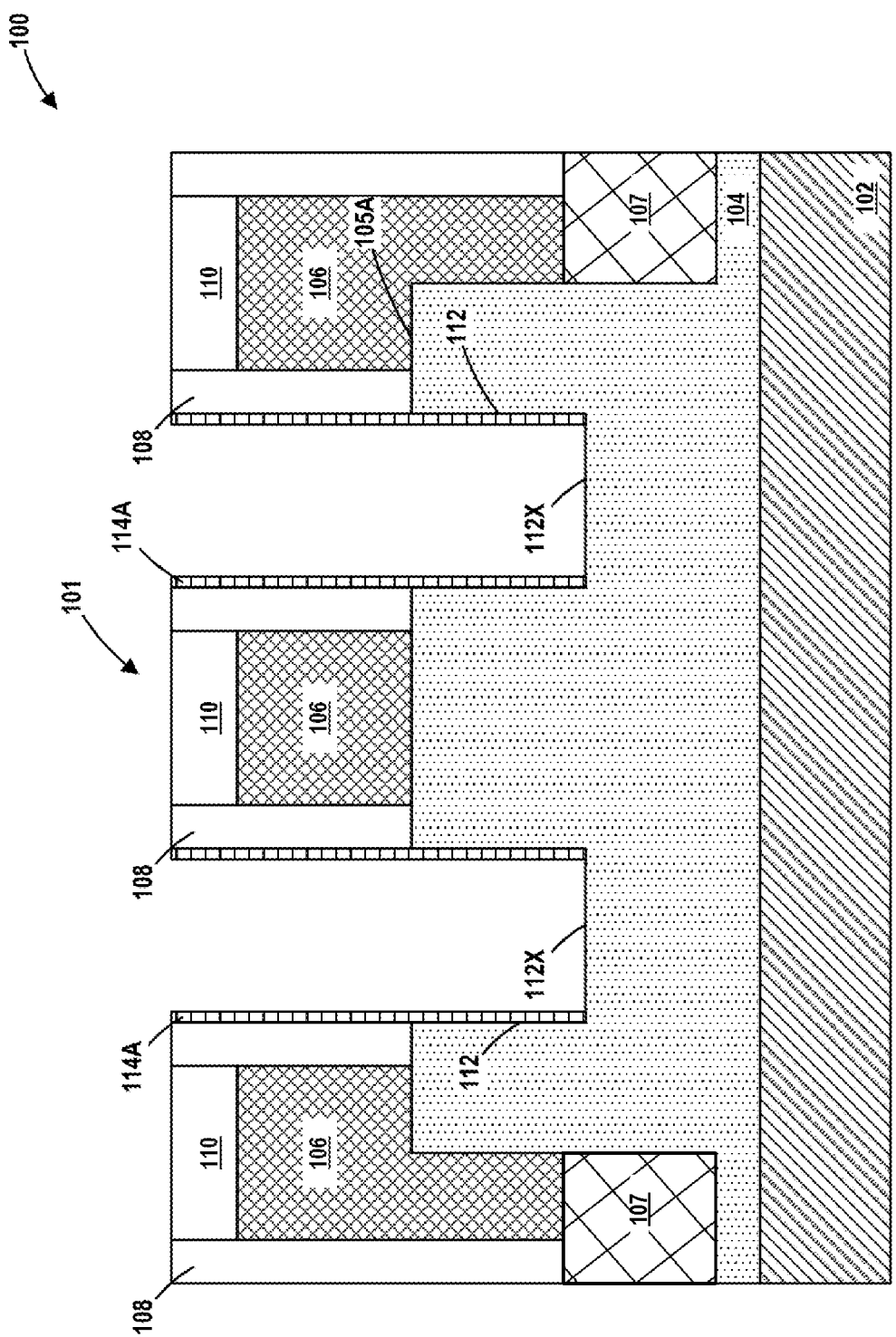
Figure 20:
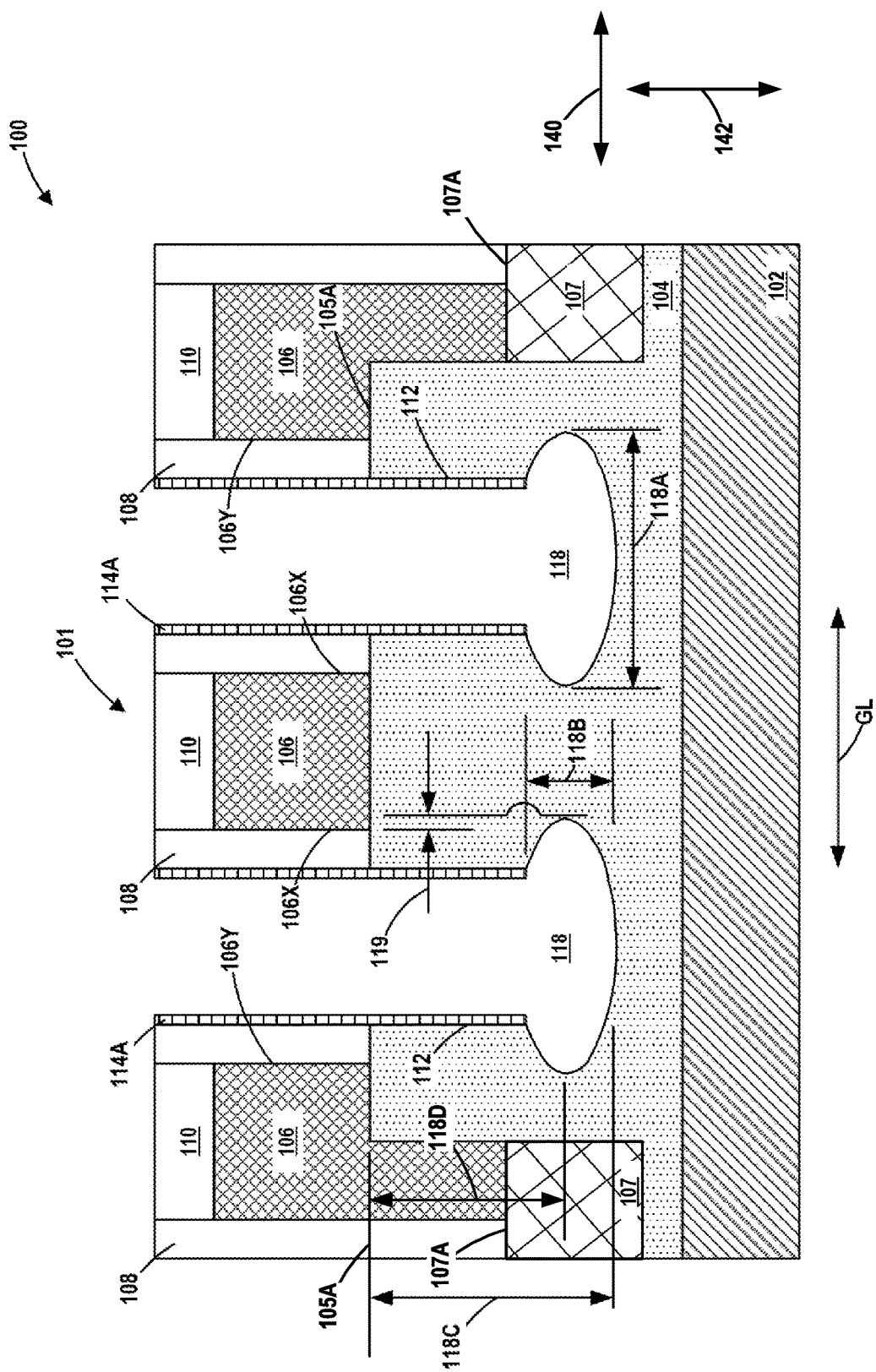
Figure 21:
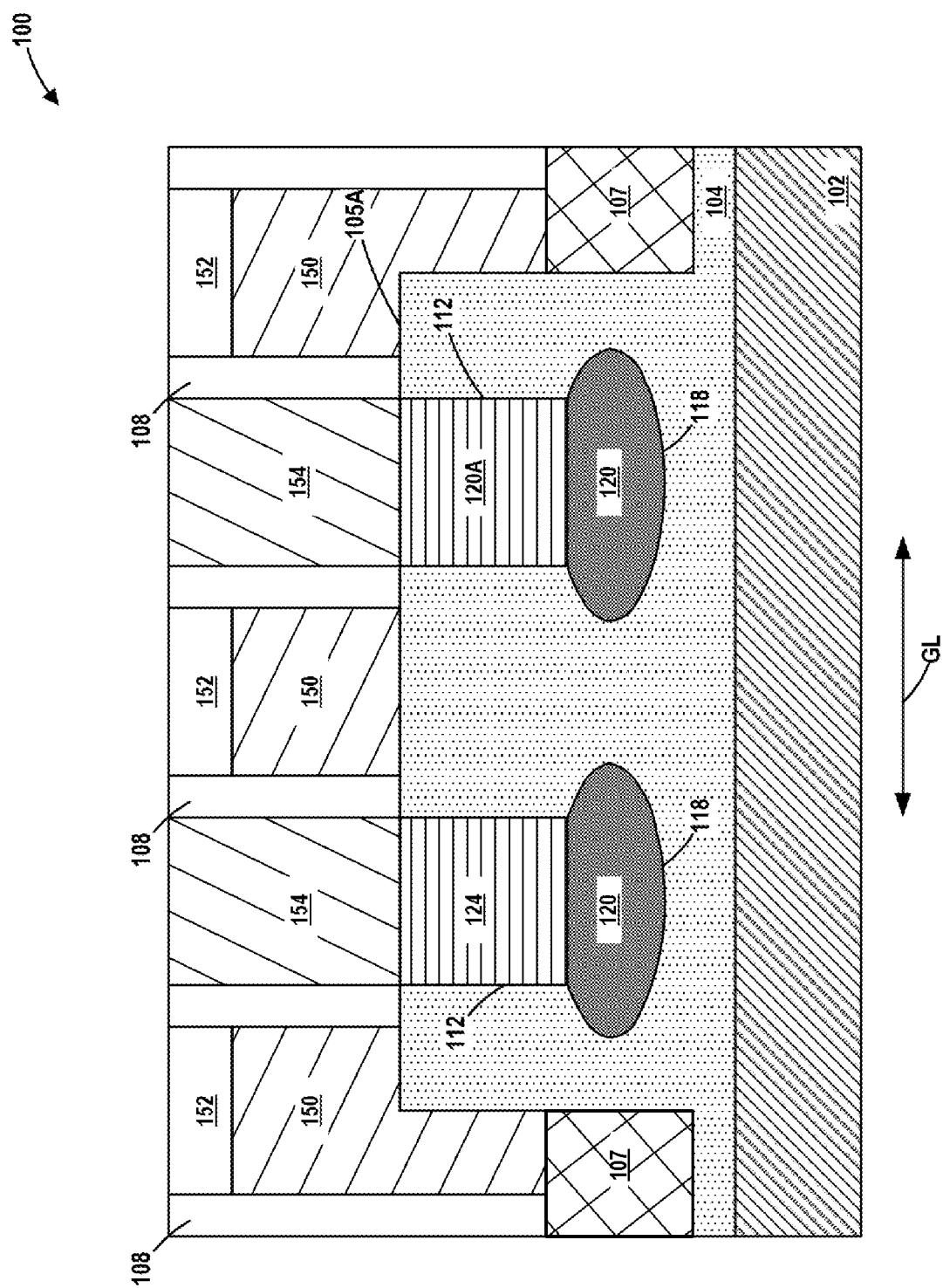

FIGS. 19-21 depict another illustrative embodiment wherein the lower insulation cavity 118 of the first and second overall cavities 121 has a generally rounded or oval configuration. In one particular example, the oval or rounded lower insulation cavity 118 may have dimensions substantially similar to those described above for the sigma-shaped (or diamond-shaped) lower insulation cavity 118. FIG. 19 corresponds to the point of processing shown in FIG. 4, i.e., after formation of the internal sidewall spacer 114A in the upper epitaxial cavities 112.

FIG. 20 depicts the transistor 101 after one or more etching processes were performed to form the oval or rounded lower insulation cavity 118. The etching process(es) used to form the lower insulation cavity 118 may have both isotropic and anisotropic characteristics. The overall size of the lower insulation cavity 118 may vary depending upon the particular application. In the particular example shown in FIG. 20, the oval shaped lower insulation cavities 118 are formed to a size such that they do not intersect one another.

FIG. 21 depicts the product 100 after several of the above-described process steps were performed, i.e., the insulation material 120 was formed in the lower insulation cavities 118, the internal sidewall spacer 114A was removed and the stressed epitaxial semiconductor material 124 was formed in the upper epitaxial cavities 112 and on and in contact with the previously formed insulation material 120. FIG. 21 also depicts the product after formation of the simplistically depicted final gate structures 150 and final gate caps 152. In this example, a portion of the insulation material 120 positioned in each of the lower insulation cavities 118 is positioned vertically under a portion of the final gate structure 150.

Figure 22:
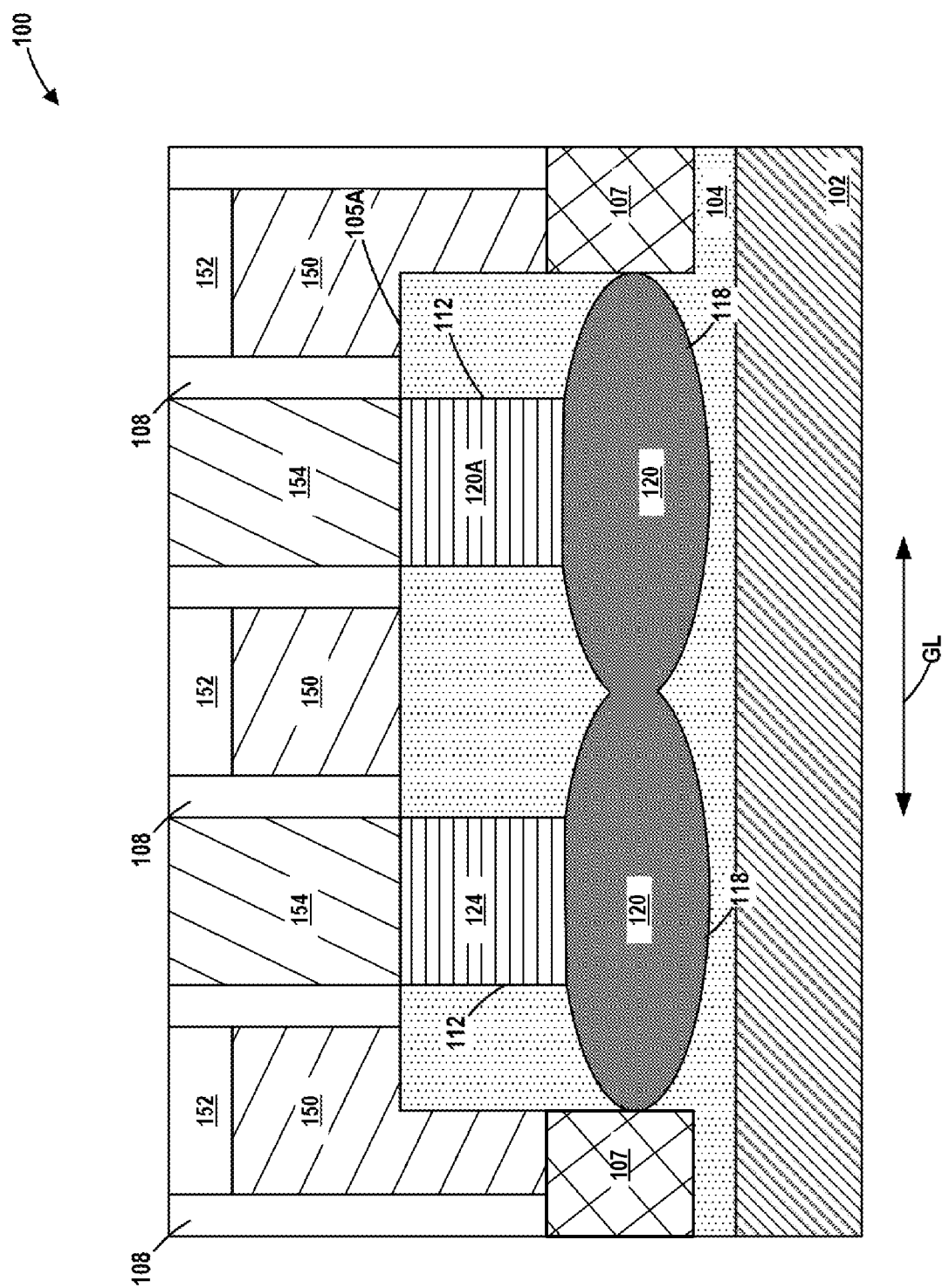

FIG. 22 depict another illustrative embodiment wherein the lower insulation cavity 118 of each the overall cavities 121 has a generally rounded or oval configuration. However, in this example, the oval or rounded lower insulation cavities 118 were formed in such a manner that they intersect one another. FIG. 22 also depicts the product 100 after several of the above-described process steps were performed, i.e., the insulation material 120 was formed in the lower insulation cavities 118, the internal sidewall spacer 114A was removed and the stressed epitaxial semiconductor material 124 was formed in the upper epitaxial cavities 112 and on and in contact with the previously formed insulation material 120. FIG. 22 also depicts the product after formation of the simplistically depicted final gate structures 150 and final gate caps 152. In this example, a portion of the insulation material 120 positioned in each of the lower insulation cavities 118 is positioned vertically under a portion of the final gate structure 150.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor, comprising:
   a gate structure positioned above a semiconductor substrate;
   first and second overall cavities formed in the semiconductor substrate on opposite sides of the gate structure, each of the first and second overall cavities comprising a substantially vertically oriented upper epitaxial cavity and a lower insulation cavity, wherein the substantially vertically oriented upper epitaxial cavity extends from an upper surface of the semiconductor substrate to the lower insulation cavity;
   an insulation material positioned in at least a portion of the lower insulation cavity of each of the first and second overall cavities; and
   epitaxial semiconductor material positioned in at least the substantially vertically oriented upper epitaxial cavity of each of the first and second overall cavities, wherein a lowermost surface of the epitaxial semiconductor material is positioned a greater depth from the upper surface of the semiconductor substrate than is a lowermost surface of the insulating material.

2. The transistor of claim 1, wherein a lateral width of the lower insulation cavity in a gate length direction of the transistor is greater than a lateral width of the substantially vertically oriented upper epitaxial cavity in the gate length direction of the transistor.

3. The transistor of claim 1, wherein the insulation material positioned in at least a portion of the lower insulation cavity of each of the first and second overall cavities substantially fills the lower insulation cavity of each of the first and second overall cavities.

4. The transistor of claim 1, wherein the epitaxial semiconductor material extends through an opening in the insulation material positioned in the lower insulation cavity of each of the first and second overall cavities.

5. The transistor of claim 1, wherein the semiconductor substrate comprises one of silicon, germanium, silicon-germanium or a III-V material, the epitaxial semiconductor material comprises one of silicon, silicon-germanium or silicon-carbon, the transistor is a FinFET transistor, the first and second overall cavities, respectively, are positioned in a source region and a drain region, respectively, of the FinFET transistor and the insulating material comprises one of silicon dioxide, a low-k material (k value less than 3.5), silicon nitride, SiCN, SiN, SiCO, or SiOCN.

6. The transistor of claim 1, further comprising an isolation structure positioned in the semiconductor substrate adjacent the lower insulation cavity, wherein the lower insulation cavity has a sigma-shaped configuration that comprises an apex and wherein an upper surface of the isolation structure is positioned at a location that is approximately level with the apex of the lower insulation cavity.

7. The transistor of claim 1, wherein, for each of the first and second overall cavities, a portion of the insulating material positioned in the lower insulation cavity is positioned vertically under a portion of the gate structure.

8. The transistor of claim 1, wherein, when viewed in a cross-section taken through the lower insulation cavity in a direction corresponding to a gate length direction of the transistor, the lower insulation cavity has one of a sigma-shaped cross-sectional configuration, a rounded cross-sectional configuration or an oval cross-sectional configuration.

9. The transistor of claim 1, wherein the lower insulation cavity of the first overall cavity intersects the lower insulation cavity of the second overall cavity.

10. The transistor of claim 1, wherein the lower insulation cavity of the first overall cavity does not intersect the lower insulation cavity of the second overall cavity.

11. The transistor of claim 1, wherein at least a portion of the epitaxial semiconductor material is positioned within the lower insulation cavity.

12. The transistor of claim 1, wherein the epitaxial semiconductor material contacts the insulation material positioned in the lower insulation cavity of each of the first and second overall cavities.

13. A transistor, comprising:
- a gate structure positioned above a semiconductor substrate;
- first and second overall cavities formed in the semiconductor substrate on opposite sides of the gate structure, each of the first and second overall cavities comprising a substantially vertically oriented upper epitaxial cavity and a lower insulation cavity, wherein the substantially vertically oriented upper epitaxial cavity extends from an upper surface of the semiconductor substrate to the lower insulation cavity, wherein a lateral width of the lower insulation cavity in a gate length direction of the transistor is greater than a lateral width of the substantially vertically oriented upper epitaxial cavity in the gate length direction of the transistor, wherein the lower insulation cavity of the first overall cavity intersects the lower insulation cavity of the second overall cavity;
- an insulation material positioned in at least a portion of the lower insulation cavity of each of the first and second overall cavities; and
- epitaxial semiconductor material positioned in at least the substantially vertically oriented upper epitaxial cavity of each of the first and second overall cavities.

14. The transistor of claim 13, wherein the insulation material positioned in at least a portion of the lower insulation cavity of each of the first and second overall cavities substantially fills the lower insulation cavity of each of the first and second overall cavities and wherein the epitaxial semiconductor material contacts the insulation material positioned in the lower insulation cavity of each of the first and second overall cavities.

15. The transistor of claim 13, wherein the epitaxial semiconductor material extends through an opening in the insulation material positioned in the lower insulation cavity of each of the first and second overall cavities.

16. The transistor of claim 13, wherein, for each of the first and second overall cavities, a portion of the insulating material positioned in the lower insulation cavity is positioned vertically under a portion of the gate structure.

17. A transistor, comprising:
- a gate structure positioned above a semiconductor substrate;
- first and second overall cavities formed in the semiconductor substrate on opposite sides of the gate structure, each of the first and second overall cavities comprising a substantially vertically oriented upper epitaxial cavity and a lower insulation cavity, wherein the substantially vertically oriented upper epitaxial cavity extends from an upper surface of the semiconductor substrate to the lower insulation cavity, wherein the lower insulation cavity of the first overall cavity intersects the lower insulation cavity of the second overall cavity, and wherein a lateral width of the lower insulation cavity in a gate length direction of the transistor is greater than a lateral width of the substantially vertically oriented upper epitaxial cavity in the gate length direction of the transistor;
- an insulation material positioned in and substantially filling the lower insulation cavity of each of the first and second overall cavities wherein, for each of the first and second overall cavities, a portion of the insulating material positioned in the lower insulation cavity is positioned vertically under a portion of the gate structure; and
- epitaxial semiconductor material positioned in at least the substantially vertically oriented upper epitaxial cavity of each of the first and second overall cavities.

18. The transistor of claim 17, wherein the epitaxial semiconductor material contacts the insulation material positioned in the lower insulation cavity of each of the first and second overall cavities.

19. The transistor of claim 17, wherein the semiconductor substrate comprises one of silicon, germanium, silicon-germanium or a III-V material, the epitaxial semiconductor material comprises one of silicon, silicon-germanium or silicon-carbon, the transistor is a FinFET transistor, the first and second overall cavities, respectively, are positioned in a source region and a drain region, respectively, of the FinFET transistor and the insulating material comprises one of silicon dioxide, a low-k material (k value less than 3.5), silicon nitride, SiCN, SiN, SiCO, or SiOCN.

20. The transistor of claim 17, further comprising an isolation structure positioned in the semiconductor substrate adjacent the lower insulation cavity, wherein the lower insulation cavity has a sigma-shaped configuration that comprises an apex and wherein an upper surface of the isolation structure is positioned at a location that is approximately level with the apex of the lower insulation cavity.

* * * * *